(12) United States Patent
Knippelmeyer et al.

(10) Patent No.: US 9,673,024 B2
(45) Date of Patent: Jun. 6, 2017

(54) PARTICLE-OPTICAL SYSTEMS AND ARRANGEMENTS AND PARTICLE-OPTICAL COMPONENTS FOR SUCH SYSTEMS AND ARRANGEMENTS

(71) Applicants: CARL ZEISS MICROSCOPY GMBH, Jena (DE); APPLIED MATERIALS ISRAEL LTD., Rehovot (IL)

(72) Inventors: Rainer Knippelmeyer, Utting am Ammersee (DE); Oliver Kienzle, Jena (DE); Thomas Kemen, Aalen (DE); Heiko Mueller, Heidelberg (DE); Stephan Uhlemann, Heidelberg (DE); Maximilian Haider, Gaiberg (DE); Antonio Casares, Aalen (DE); Steven Rogers, D.N. Emek Sorek (IL)

(73) Assignees: Applied Materials Israel, Ltd., Rehovot (IL); Carl Zeiss Microscopy GmbH, Jena (DE)

( * ) Notice: Subject to any disclaimer, the term of this patent is extended or adjusted under 35 U.S.C. 154(b) by 0 days.

(21) Appl. No.: 14/975,314

(22) Filed: Dec. 18, 2015

(65) Prior Publication Data
US 2016/0111251 A1    Apr. 21, 2016

Related U.S. Application Data

(60) Division of application No. 14/165,573, filed on Jan. 27, 2014, now Pat. No. 9,224,576, which is a division
(Continued)

(51) Int. Cl.
*H01J 37/30* (2006.01)
*H01J 37/10* (2006.01)
(Continued)

(52) U.S. Cl.
CPC .......... *H01J 37/3007* (2013.01); *B82Y 10/00* (2013.01); *B82Y 40/00* (2013.01); *H01J 37/09* (2013.01);
(Continued)

(58) Field of Classification Search
USPC ......... 250/206, 307, 309–311, 396 R, 492.1, 250/492.2, 492.3, 492.21, 492.22
See application file for complete search history.

(56) References Cited

U.S. PATENT DOCUMENTS 2,877,369 A    3/1959  Nicoll
4,419,581 A    12/1983  Nakagawa et al.
(Continued)

FOREIGN PATENT DOCUMENTS

CN    1404617 A    3/2003
CN    1411025 A    4/2003
(Continued)

OTHER PUBLICATIONS

G.I. Winograd, "A Multi-Blanker for Parallel Electron Beam Lithography," Ph.D. thesis, Stanford University, May 2001, pp. 1-141.
(Continued)

*Primary Examiner* — Bernard Souw
(74) *Attorney, Agent, or Firm* — Morris & Kamlay LLP

(57) ABSTRACT

A particle-optical arrangement comprises a charged-particle source for generating a beam of charged particles; a multi-aperture plate arranged in a beam path of the beam of charged particles, wherein the multi-aperture plate has a plurality of apertures formed therein in a predetermined first array pattern, wherein a plurality of charged-particle beamlets is formed from the beam of charged particles downstream of the multi-aperture plate, and wherein a plurality of beam spots is formed in an image plane of the apparatus by
(Continued)

the plurality of beamlets, the plurality of beam spots being arranged in a second array pattern; and a particle-optical element for manipulating the beam of charged particles and/or the plurality of beamlets; wherein the first array pattern has a first pattern regularity in a first direction, and the second array pattern has a second pattern regularity in a second direction electron-optically corresponding to the first direction, and wherein the second regularity is higher than the first regularity.

15 Claims, 15 Drawing Sheets

Related U.S. Application Data of application No. 13/342,017, filed on Dec. 31, 2011, now Pat. No. 8,637,834, which is a division of application No. 12/459,078, filed on Jun. 25, 2009, now Pat. No. 8,097,847, which is a division of application No. 11/808,845, filed on Jun. 13, 2007, now Pat. No. 7,554,094, which is a division of application No. 11/366,533, filed on Mar. 3, 2006, now Pat. No. 7,244,949, which is a continuation of application No. PCT/US2004/029079, filed on Sep. 7, 2004.

(60) Provisional application No. 60/500,256, filed on Sep. 5, 2003.

(51) Int. Cl.
*H01J 37/147* (2006.01)
*B82Y 10/00* (2011.01)
*B82Y 40/00* (2011.01)
*H01J 37/09* (2006.01)
*H01J 37/28* (2006.01)
*H01J 37/317* (2006.01)
*H01J 37/14* (2006.01)

(52) U.S. Cl.
CPC .............. *H01J 37/10* (2013.01); *H01J 37/14* (2013.01); *H01J 37/28* (2013.01); *H01J 37/3177* (2013.01); *H01J 2237/047* (2013.01); *H01J 2237/0435* (2013.01); *H01J 2237/0453* (2013.01); *H01J 2237/04735* (2013.01); *H01J 2237/04756* (2013.01); *H01J 2237/06* (2013.01); *H01J 2237/14* (2013.01); *H01J 2237/2817* (2013.01); *H01J 2237/31774* (2013.01)

(56) References Cited

U.S. PATENT DOCUMENTS

| | | | |
|---|---|---|---|
| 4,737,682 A | 4/1988 | Alig et al. | |
| 4,914,282 A | 4/1990 | Akashi et al. | |
| 4,990,822 A | 2/1991 | Guzowski et al. | |
| 5,012,105 A | 4/1991 | Ando et al. | |
| 5,483,074 A | 1/1996 | True et al. | |
| 5,485,209 A | 1/1996 | Muramoto et al. | |
| 5,548,183 A | 8/1996 | Miyoshi et al. | |
| 5,578,822 A | 11/1996 | Van Der Mast et al. | |
| 5,604,394 A | 2/1997 | Saito et al. | |
| 5,730,887 A | 3/1998 | Simpson et al. | |
| 5,808,310 A | 9/1998 | Yamashita et al. | |
| 5,825,038 A | 10/1998 | Blake et al. | |
| 5,834,783 A | 11/1998 | Muraki et al. | |
| 5,892,224 A | 4/1999 | Nakasuji | |
| 6,014,200 A | 1/2000 | Sogard et al. | |
| 6,040,576 A | 3/2000 | Benner et al. | |
| 6,153,970 A | 11/2000 | Chen et al. | |
| 6,252,412 B1 | 6/2001 | Talbot et al. | |
| 6,310,341 B1 | 10/2001 | Todokoro et al. | |
| 6,455,848 B1 | 9/2002 | Krijn et al. | |
| 6,465,783 B1 | 10/2002 | Nakasuji et al. | |
| 6,486,480 B1 | 11/2002 | Leung et al. | |
| 6,559,586 B1 | 5/2003 | Alig et al. | |
| 6,593,686 B1 | 7/2003 | Yui et al. | |
| 6,617,595 B1 | 9/2003 | Okunuki et al. | |
| 6,764,743 B2 | 7/2004 | Kato et al. | |
| 6,855,929 B2 | 2/2005 | Hatakeyama et al. | |
| 6,868,175 B1 | 3/2005 | Yamamoto et al. | |
| 6,891,168 B2 | 5/2005 | Knippelmeyer et al. | |
| 6,903,337 B2 | 6/2005 | Kienzle et al. | |
| 6,965,153 B1 | 11/2005 | Ono et al. | |
| 6,967,328 B2 | 11/2005 | Kienzle et al. | |
| 7,109,483 B2 | 9/2006 | Nakasuji et al. | |
| 7,135,676 B2 | 11/2006 | Nakasuji et al. | |
| 7,244,949 B2 * | 7/2007 | Knippelmeyer ....... | B82Y 10/00 250/310 |
| 7,297,949 B2 | 11/2007 | Nakasuji et al. | |
| 7,335,894 B2 | 2/2008 | Frosien et al. | |
| 7,368,738 B2 | 5/2008 | Platzgummer et al. | |
| 7,554,094 B2 * | 6/2009 | Knippelmeyer ....... | B82Y 10/00 250/310 |
| 7,592,590 B2 | 9/2009 | Frosien et al. | |
| 7,796,801 B2 | 9/2010 | Kitamura et al. | |
| 7,817,844 B2 | 10/2010 | Kitamura et al. | |
| 8,026,495 B2 * | 9/2011 | Platzgummer ......... | B82Y 10/00 250/492.22 |
| 8,039,813 B2 | 10/2011 | Casares et al. | |
| 8,097,847 B2 * | 1/2012 | Knippelmeyer ....... | B82Y 10/00 250/309 |
| 8,637,834 B2 * | 1/2014 | Knippelmeyer ....... | B82Y 10/00 250/307 |
| 9,224,576 B2 * | 12/2015 | Knippelmeyer ....... | B82Y 10/00 |
| 9,324,537 B2 * | 4/2016 | Kemen ................. | H01J 37/045 |
| 2001/0028044 A1 | 10/2001 | Hamaguchi et al. | |
| 2001/0032939 A1 | 10/2001 | Gerlach et al. | |
| 2001/0052576 A1 | 12/2001 | Shimada et al. | |
| 2001/0054690 A1 | 12/2001 | Shimada et al. | |
| 2002/0011560 A1 | 1/2002 | Sheehan et al. | |
| 2002/0015518 A1 | 2/2002 | Matsuoka et al. | |
| 2002/0028399 A1 | 3/2002 | Nakasuji et al. | |
| 2002/0033344 A1 | 3/2002 | Mabuchi et al. | |
| 2002/0033449 A1 | 3/2002 | Nakasuji et al. | |
| 2002/0036264 A1 | 3/2002 | Nakasuji et al. | |
| 2002/0039829 A1 | 4/2002 | Yasuda et al. | |
| 2002/0094483 A1 | 7/2002 | Hattori et al. | |
| 2002/0109090 A1 | 8/2002 | Nakasuji et al. | |
| 2002/0130262 A1 | 9/2002 | Nakasuji et al. | |
| 2002/0142496 A1 | 10/2002 | Nakasuji et al. | |
| 2002/0148961 A1 | 10/2002 | Nakasuji et al. | |
| 2002/0148975 A1 | 10/2002 | Kimba et al. | |
| 2002/0179855 A1 | 12/2002 | Muraki et al. | |
| 2003/0001095 A1 | 1/2003 | Lo et al. | |
| 2003/0066961 A1 | 4/2003 | Kienzle et al. | |
| 2003/0089859 A1 | 5/2003 | Adamec | |
| 2003/0094584 A1 | 5/2003 | Yui et al. | |
| 2003/0122087 A1 | 7/2003 | Muraki et al. | |
| 2003/0155509 A1 | 8/2003 | Nakasuji et al. | |
| 2003/0155534 A1 | 8/2003 | Platzgummer et al. | |
| 2003/0189181 A1 | 10/2003 | Ohta et al. | |
| 2004/0036031 A1 | 2/2004 | Rose et al. | |
| 2004/0065827 A1 | 4/2004 | Kienzle et al. | |
| 2004/0075053 A1 | 4/2004 | Preikszas et al. | |
| 2004/0108457 A1 | 6/2004 | Kienzle et al. | |
| 2004/0113092 A1 | 6/2004 | Knippelmeyer et al. | |
| 2004/0135102 A1 | 7/2004 | Muraki et al. | |
| 2004/0135515 A1 | 7/2004 | Hamashima et al. | |
| 2004/0232349 A1 | 11/2004 | Kruit et al. | |
| 2005/0242303 A1 | 11/2005 | Platzgummer et al. | |
| 2006/0151711 A1 | 7/2006 | Frosien et al. | |
| 2006/0226360 A1 | 10/2006 | Frosien et al. | |
| 2006/0255268 A1 | 11/2006 | Frosien et al. | |
| 2006/0289804 A1 | 12/2006 | Knippelmeyer et al. | |
| 2007/0045536 A1 | 3/2007 | Nakasuji et al. | |
| 2007/0057186 A1 | 3/2007 | Nakasuji et al. | |
| 2008/0042060 A1 | 2/2008 | Nakasuji et al. | |
| 2008/0054184 A1 | 3/2008 | Knippelmeyer et al. | |

(56) References Cited

U.S. PATENT DOCUMENTS

| | | | |
|---|---|---|---|
| 2008/0099697 | A1 | 5/2008 | Watanabe et al. |
| 2008/0121804 | A1 | 5/2008 | Nakasuji et al. |
| 2008/0121810 | A1 | 5/2008 | Liu et al. |
| 2009/0256075 | A1 | 10/2009 | Kemen et al. |
| 2010/0181479 | A1 | 7/2010 | Knippelmeyer et al. |
| 2013/0248731 | A1 | 9/2013 | Tanimoto et al. |
| 2014/0158902 | A1 | 6/2014 | Knippelmeyer et al. |

FOREIGN PATENT DOCUMENTS

| | | | |
|---|---|---|---|
| DE | 10107910 | A1 | 8/2002 |
| EP | 0794552 | A2 | 9/1997 |
| EP | 1253619 | A2 | 10/2002 |
| EP | 1389793 | A2 | 2/2004 |
| GB | 2352323 | A | 1/2001 |
| JP | 61061414 | A | 3/1986 |
| JP | 61259440 | A | 11/1986 |
| JP | 61277145 | A | 12/1986 |
| JP | 62229643 | A | 10/1987 |
| JP | 63019746 | A | 1/1988 |
| JP | 63129752 | A | 6/1988 |
| JP | 01195581 | A | 8/1989 |
| JP | 6223767 | | 8/1994 |
| JP | 06223767 | A | 8/1994 |
| JP | 07192674 | A | 7/1995 |
| JP | H09-245708 | A | 9/1997 |
| JP | 09275068 | A | 10/1997 |
| JP | H09288991 | | 11/1997 |
| JP | H09-311112 | A | 12/1997 |
| JP | 200090866 | A | 3/2000 |
| JP | 2000277417 | A | 10/2000 |
| JP | 2000285840 | A | 10/2000 |
| JP | 2001052998 | A | 2/2001 |
| JP | 2001118491 | A | 4/2001 |
| JP | 2001133234 | A | 5/2001 |
| JP | 2001345259 | A | 12/2001 |
| JP | 2001345260 | A | 12/2001 |
| JP | 2001345261 | A | 12/2001 |
| JP | 2002110534 | A | 4/2002 |
| JP | 2002184338 | A | 6/2002 |
| JP | 2002532844 | A | 10/2002 |
| JP | 2003031171 | A | 1/2003 |
| JP | 2003045789 | A | 2/2003 |
| JP | 2003083917 | A | 3/2003 |
| JP | 2003203836 | A | 7/2003 |
| JP | 2003297732 | A | 10/2003 |
| JP | 2004134386 | A | 4/2004 |
| JP | 2004193516 | A | 7/2004 |
| JP | 2006520078 | A | 8/2006 |
| WO | 9957745 | A1 | 11/1999 |
| WO | 0201597 | A1 | 1/2002 |
| WO | 02091421 | | 11/2002 |
| WO | 2004081910 | A1 | 9/2004 |
| WO | 2005024881 | A2 | 3/2005 |

OTHER PUBLICATIONS

H. MOiier et al., "A beam separator with small aberrations," Journal of Electron Microscopy 48(3), 1999, pp. 191-204.

International Search Report issued in corresponding international application PCT/US2004/029079, mailed Apr. 4, 2007.

Notification of Reason(s) for Rejection in Japanese Patent Application No. 2008-099010, dispatch date Jun. 7, 2011 ,English-language translation only).

Office Action dated Jun. 9, 2016, with translation thereof, for corresponding Japanese patent application No. 2014-250291.

Office Action in Japanese Application No. 2012-285348 mailed Jul. 31, 2014.

Office Action mailed Nov. 18, 2010 in Japanese Patent Application No. JP 2006-522518, dispatch dated 18 D Nov. 2010 (3 pages+ 3 page English-language translation).

R. Fink et al., "SMART: a planned ultrahigh-resolution spectromicroscope for BESSY 11," Journal of Electron Spectroscopy and Related Phenomena 84 (Mar. 1997), pp. 213-250.

Supplementary European Search Report dated Nov. 17, 2010 in Application No. 04783363.7-220811668662 PCT/US2004029079 (3 pages).

"Office Action dated Jul. 3, 2014 from parallel Chinese patent application No. 201210111707.0".

"Office Action dated Jun. 10, 2014 from parallel Japanese patent application No. 2013-153718".

"English-Language translation of Office Action dated Jan. 24, 2012 from parallel Japanese patent application No. 2008-099010, 3 pp.", p. 3.

"Extended European Search Report dated Jul. 12, 2013 from parallel European patent application 12 190 696.0", p. 14.

"Extended European Search Report dated Mar. 1, 2013 from parallel European patent application 12 190 689.5".

"Extended European Search Report dated Mar. 12, 2013 from parallel European patent application 12 190 693.7".

"Extended European Search Report dated Mar. 15, 2013 from parallel European patent application 12190692.9".

"Extended European Search Report dated Mar. 15, 2013 from parallel European patent application 12190694.5".

"Extended European Search Report dated Mar. 19, 2013 from parallel European patent application 12 190 693.7".

"Extended European Search Report Dated Mar. 6, 2013 from parallel European Patent Application No. 12190690.3".

"Extended European Search Report dated Mar. 7, 2013 from parallel European patent application 12190695.2".

"Extended European Search Report Dated Mar. 7, 2013 from parallel European Patent Application No. 12190691.1".

"Office Action dated Aug. 28, 2012 from parallel Japanese patent application No. 2008-099010 (5 Pages, with 5-page English-language translation)", p. 5.

"Office Action dated Jan. 23, 2014 from parallel Japanese patent application No. 2012-285348 (4 pages), with English language translation (4 pages)", p. 4.

"Office Action dated Jan. 24, 2013 from parallel Japenese Patent application No. 2011-111070".

"Office Action dated Jan. 24, 2013 from parallel Japenese Patent application No. 2011-111070 (English Language Translation)".

Office Action dated May 16, 2014 from parallel European patent application No. 12 190 689.5.

"Office Action dated May 20, 2014 from parallel European patent application No. 12 190 690.3".

"Partial European Search Report dated Mar. 26, 2013 from parallel European patent application No. 12 190 696.0".

Roelofs, et al., "Feasibility of multi-beam electron lithography", Microelectronic Engineering, Elsevier Science Publishers B.V., Amsterdam, NL, vol. 2, No. 4, Dec. 1, 1984, Jan. 30, 2014, pp. 259-279.

* cited by examiner

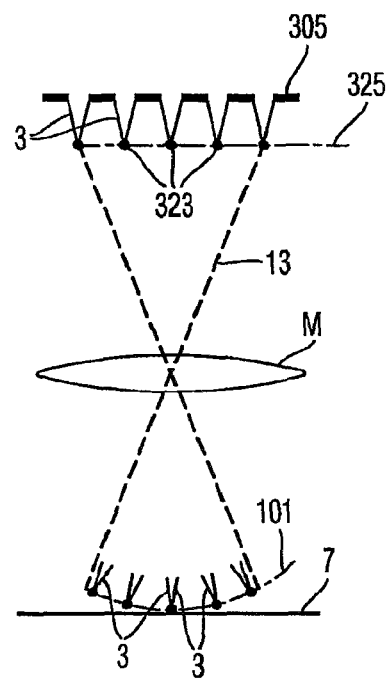 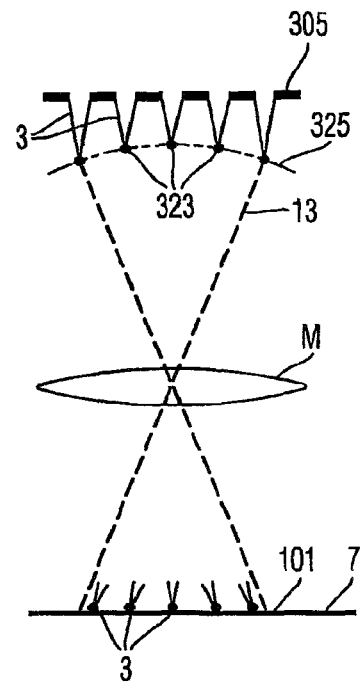
Fig. 16    Fig. 17
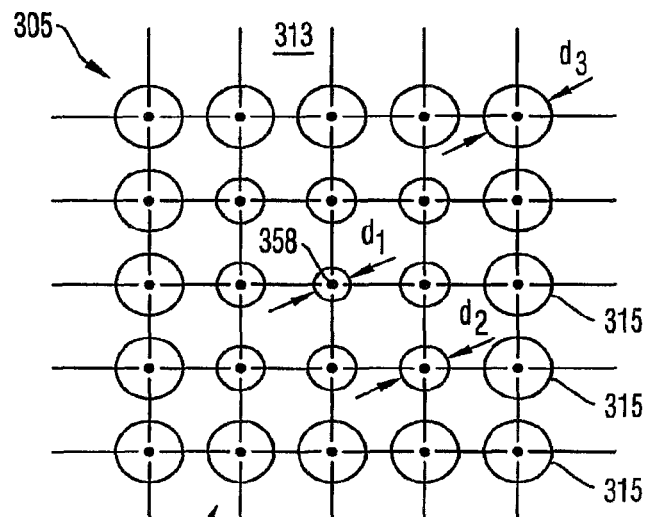
Fig. 18

PARTICLE-OPTICAL SYSTEMS AND ARRANGEMENTS AND PARTICLE-OPTICAL COMPONENTS FOR SUCH SYSTEMS AND ARRANGEMENTS

RELATED APPLICATIONS

This application is a divisional of U.S. patent application Ser. No. 11/808,845 filed on Jun. 13, 2007, the entire contents of which are incorporated herein by reference, to issue as U.S. Pat. No. 7,554,094 on Jun. 30, 2009. U.S. patent application Ser. No. 11/808,845 filed on Jun. 13, 2007 is a divisional of U.S. patent application Ser. No. 11/366,533 filed on Mar. 3, 2006, now U.S. Pat. No. 7,244,949, the entire contents of which are incorporated herein by reference. U.S. Ser. No. 11/366,533 is a continuation of International Application No. PCT/US2004/029079 filed on Sep. 7, 2004, the entire contents of which are incorporated herein by reference, which was published in English and which claims the benefit under 35 U.S.C. 119(e) of U.S. Provisional Patent Application No. 60/500,256 filed on Sep. 5, 2003, the entire contents of which are incorporated herein by reference.

BACKGROUND OF THE INVENTION

Field of the Invention

The invention relates to particle-optical systems using multiple beamlets of charged particles, such as an electron microscopy apparatus and electron lithography apparatus.

Further the invention relates to particle-optical components and arrangements which may be used in particle-optical systems using multiple beamlets of charged particles; the particle-optical components are, however, not limited in the application to systems using multiple beamlets. Such particle-optical components may be used in particle-optical systems using only one single beam of charged particles or plural beams or beamlets of charged particles.

The invention may be applied to charged particles of any type, such as electrons, positrons, myons, ions and others.

Brief Description of Related Art

A conventional particle-optical system is known from U.S. Pat. No. 6,252,412 B1. The electron microscopy apparatus disclosed therein is used for inspecting an object, such as a semiconductor wafer. A plurality of primary electron beams is focused in parallel to each other on the object to form a plurality of primary electron spots thereon. Secondary electrons generated by the primary electrons and emanating from respective primary electron spots are detected. For each primary electron beam a separate electron beam column is provided. The plurality of separate electron beam columns is closely packed to each other. A density of the primary electron beam spots formed on the object is limited by a remaining foot step size of the electron beam columns forming the electron microscopy apparatus. Thus, also the number of primary electron beam spots which may be found at the same time on the object is limited in practice resulting in a limited throughput of the apparatus when inspecting semiconductor wafers of a high surface area at a high resolution.

From U.S. Pat. No. 5,892,224, US 2002/0148961 A1, US 2002/0142496 A1, US 2002/0130262 A1, US 2002/0109090 A1, US 2002/0033449 A1, US 2002/0028399 A1, there are known electron microscopy apparatuses using a plurality of primary electron beamlets focused on the surface of the object to be inspected. The beamlets are generated by a multi-aperture plate having a plurality of apertures formed therein, wherein an electron source generating a single electron beam is provided upstream of the multi-aperture plate for illuminating the apertures formed therein. Downstream of the multiple-aperture plate a plurality of electron beamlets is formed by those electrons of the electron beam passing the apertures. The plurality of primary electron beamlets is focused on the object by an objective lens having an aperture which is passed by all primary electron beamlets. An array of primary electron spots is thus formed on the object. Secondary electrons emanating from each primary electron spot form a respective secondary electron beamlet, such that also a plurality of secondary electron beamlets corresponding to the plurality of primary electron beam spots is generated. The plurality of secondary electron beamlets pass the objective lens, and the apparatus provides a secondary electron beam path such that each of the secondary electron beamlets is supplied to a respective one of a plurality of detector pixels of a CCD electron detector. A Wien-filter is used for separating the secondary electron beam path from a beam path of the primary electron beamlets.

Since one common primary electron beam path comprising the plurality of primary electron beamlets and one common secondary electron beam path comprising the plurality of secondary electron beamlets is used, one single electron-optical column may be employed, and the density of primary electron beam spots formed on the object is not limited by a foot step size of the single electron-optical column.

The number of primary electron beam spots disclosed in the embodiments of the above mentioned documents is in the order of some ten spots. Since the number of primary electron beam spots formed at a same time on the object limits the throughput, it would be advantageous to increase the number of primary electron beam spots for achieving a higher throughput. It has been found, however, that it is difficult to increase the number of primary electron beam spots formed at a same time, or to increase a primary electron beam spot density, employing the technology disclosed in those documents while maintaining a desired imaging resolution of the electron microscopy apparatus.

It is therefore an object of the present invention to provide particle-optical systems using charged-particle beamlets of an increased density and allowing to manipulate the charged-particle beamlets with an increased accuracy.

It is a further object of the present invention to provide particle-optical components for manipulating beams and beamlets of charged particles with an increased accuracy.

SUMMARY OF THE INVENTION

As will be described in more detail hereinafter particle-optical components, particle-optical arrangements and particle-optical systems according to the invention may use a plurality of charged-particle beamlets and manipulate the same with an increased accuracy.

According to one embodiment of the invention there is provided a particle-optical arrangement for forming a plurality of charged-particle beamlets wherein the beamlets are arranged in an array pattern of a high regularity. The high regularity array pattern is formed by the beamlets at a desired location along the beam path of the beamlets. For instance, the high regularity array pattern may be formed at an image plane or intermediate image plane where the beamlets each form a respective focus.

The particle-optical arrangement comprises at least one charged-particle source for generating at least one beam of charged particles. The charged-particle beamlets are formed by particles of the beam of charged particles passing through apertures formed in the multi-aperture plate. There may be one or plural further multi-aperture plates arranged in the beam path of the beamlets wherein the beamlets pass through apertures formed in the one or plural further multi-aperture plates.

The particle-optical arrangement may further comprise at least one focusing lens or other particle-optical element for manipulating the at least one beam of charged particles and/or the plurality of charged-particle beamlets. Such particle-optical element typically contributes to an optical distortion of the particle-optical arrangement. Such distortion deteriorates an achievable accuracy for manipulating the beamlets and will prevent the formation of the desired high regularity array pattern of the beamlet array at the desired position in the beam path of the beamlets.

The high regularity array pattern has a particle-optical correspondence with an array pattern of the apertures formed in the at least one multi-aperture plate. The positions of the apertures in the multi-aperture plates are now such determined that substantially the desired high regularity array pattern of the beamlets is formed downstream of the at least one multi-aperture plate. The array pattern of the apertures in the multi-aperture plate will then have a lower regularity as compared to the regularity of the high regularity array pattern.

The displacement of positions of the apertures from a high regularity pattern to form a pattern of lower regularity is, however, not limited to compensating a distortion introduced by one or the other particle-optical element and may be provided for any other purposes.

It is not necessary that the increase of regularity is provided for all directions of the patterns. It may be sufficient to increase the regularity only in one particular direction, such as a direction transversely to a movement of the object relative to an objective lens of the arrangement. Further, it may be sufficient that a projection of a certain subset of the beamlets in a predetermined direction onto a plane forms the pattern having the increased regularity when compared to a corresponding regularity determined from a corresponding subset of apertures projected in a direction which electron-optically corresponds to the predetermined direction.

The regularities of the high regularity array pattern of the beamlets and of the lower regularity pattern of the apertures may be determined by e.g. some suitable mathematical means such as a method for determining a spatial correlation between the apertures and a one- or two-dimensional Fourier analysis applied to the positions of centers of the respective beamlets and of the respective apertures.

The at least one particle-optical element may comprise a focusing lens, such as an objective lens, for focusing the beamlets onto an object positionable in the image plane of the particle-optical arrangement.

For compensating typical distortions of focusing lenses, distances between adjacent apertures in the multi-aperture plate are preferably continuously decreasing with an increasing distance of the respective apertures from a center of the array pattern formed by the apertures in the multi-aperture plate.

According to a further embodiment of the invention there is provided a particle-optical arrangement having, similar to the arrangement illustrated above, at least one charged-particle source, and at least one multi-aperture plate. The arrangement may further comprise at least one particle-optical element for manipulating at least one beam of charged particles generated by the source, or for manipulating the plurality of charged-particle beamlets.

Such particle-optical element typically contributes to an optical astigmatism of the particle-optical arrangement. For compensating such astigmatism the apertures formed in the at least one multi-aperture plate comprise apertures having an elliptical shape rather than a perfectly circular shape.

The provision of the elliptical aperture shapes is, however, not limited to compensating an astigmatism introduced by one or the other particle-optical element and may be provided for any other purposes.

According to one embodiment, an ellipticity of the elliptical shapes of the aperture preferably increases with increasing distance from a center of the aperture pattern for compensating an astigmatism typically introduced by a focusing lens.

A long axis of the elliptical shapes may be radially oriented with respect to a center of the aperture pattern, or the long axis may be oriented under an angle to the radial direction. If the long axis is oriented under an angle with respect to the radial direction, such angle may increase with increasing distance from the center of the aperture pattern.

According to a further embodiment of the invention there is provided a particle-optical arrangement comprising, similar to the arrangement as illustrated above, at least one charged-particle source, and at least one multi-aperture plate. The arrangement may further comprise at least one particle-optical element for manipulating the at least one beam of charged particles generated by the source or for manipulating a plurality of charged-particle beamlets.

The particle-optical element may contribute to an optical field curvature of the arrangement.

For compensating such field curvature a diameter of the apertures formed in the multi-aperture plate changes with an increasing distance from a center of the aperture pattern. The change of diameters may be such that the diameter of the apertures increases or decreases with increasing distance from the center of the aperture pattern.

The change of diameters of the apertures is, however, not limited to compensating a field curvature introduced by one or the other particle-optical element and may be provided for any other purposes.

According to a further embodiment of the invention there is provided a particle-optical component which may be advantageously used in a particle-optical system using a plurality of charged-particle beamlets. The particle-optical component may be used in such system for compensating a field curvature introduced by one or the other particle-optical element of the system, or, the particle-optical component may be used in such system for any other suitable purpose.

The particle-optical component comprises at least one multi-aperture plate having a plurality of apertures formed therein, for manipulating particles of a charged-particle beamlet passing therethrough. The multi-aperture plate is formed of plural layer portions which are arranged in substantially a single plane, wherein plural apertures are formed in each of the plural layer portions. The layer portions are formed of a material which is electrically sufficiently conductive such that the layer portion defining a respective aperture therein may be maintained at a predetermined electrical potential with a sufficient accuracy depending on the desired application. Adjacent conductive layer portions are not directly connected with each other. For electrically separating the adjacent conductive layer portions from each other an electrically sufficiently resistant gap may be advantageously formed between such adjacent conductive layer portions. The gap is sufficiently resistant to allow for different electrical potentials being applied to the adjacent conductive layer portions with the sufficient accuracy.

Even though the adjacent conductive layer portions are not directly electrically connected with each other there may be provided predetermined resistors for connecting adjacent conductive layer portions or non-adjacent conductive layer portions with each other for maintaining the conductive layer portions at the desired electrical potentials.

According to a preferred embodiment there are at least two ring-shaped portions provided wherein one ring-shaped portion is positioned in an interior of the other ring-shaped portion.

A radial width of the ring-shaped conductive layer portions preferably decreases with an increasing distance from a center of the aperture pattern formed in the multi-aperture plate.

The multi-aperture plate described herein above may be provided for manipulating charged particles of the beamlets passing through respective apertures formed in the multi-aperture plate. Such manipulation of the beamlets may be achieved by maintaining the plate defining the respective aperture at a suitable electrical potential. The manipulation of the beamlet may thus comprise providing a focusing, defocusing and deflecting effect or any other effect and combinations of these effects on the beamlet. The electrical potential at which the plate defining plural apertures is maintained may generate an electrical field extending in a direction upstream or downstream of the beamlet and away from the multi-aperture plate. Due to the presence of the plural apertures in the multi-aperture plate such electrical field will deviate from an homogeneous field which would be generated by a plate having no apertures formed therein. The deviation from the homogeneous electrical field may have a disadvantageous effect on the desired type of manipulation of the beamlet by the respective aperture.

According to a further embodiment of the invention there is provided a particle-optical component comprising a first multi-aperture plate made of an insulating substrate and having a plurality of apertures formed therethrough. An interior of the apertures formed in the insulating substrate is covered with a conductive layer. An advantage of such conductive layer provided in the interior of the apertures is a contribution of the layers to screening stray electric fields originating from adjacent or more distant apertures. A conductivity of the layer may be designed such that a sufficient screening will be achieved.

According to a simplified design rule, a total resistance across the multi-aperture plate, i.e. the resistance between the two main flat surfaces of the multi-aperture plate is in a range of about $250\Omega$ to 8 M$\Omega$, a range of about $250\Omega$ to 4 M$\Omega$, a range of about 4 M$\Omega$ to 8 M$\Omega$, a range of about $250\Omega$ to $800\Omega$, a range of about $800\Omega$ to 1.5 M$\Omega$, a range of about 1.5 M$\Omega$ to 3 M$\Omega$, a range of about 3 M$\Omega$ to 5 M$\Omega$, and/or a range of about 5 M$\Omega$ to 8 M$\Omega$.

A further multi-aperture plate may be provided in close contact with the first multi-aperture plate on one or on both sides thereof.

According to an embodiment the conductive layer also covers one or both main surfaces of the first multi-aperture plate. The conductive layer then forms an integral portion of the first multi-aperture plate, and the further multi-aperture plate, if such is provided, will be formed in direct contact with the conductive layer, accordingly.

The further multi-aperture plate is preferably made of a conductive material having a conductivity higher than a conductivity of the conductive layer provided in the apertures of the first multi-aperture plate.

According to a further embodiment of the invention there is provided a particle-optical component having at least one multi-aperture plate with a plurality of apertures formed therein, wherein the multi-aperture plate is made of a conductive material such that an electrical resistance between both main flat surfaces of the first multi-aperture plate is in a range of about 250 to to 8 M$\Omega$, a range of about $250\Omega$ to 4 M$\Omega$, a range of about 4 M$\Omega$ to 8 M$\Omega$, a range of about $250\Omega$ to $800\Omega$, a range of about $800\Omega$ to 1.5 M$\Omega$, a range of about 1.5 M$\Omega$ to 3 M$\Omega$, a range of about 3 M$\Omega$ to 5 M$\Omega$, and/or a range of about 5 M$\Omega$ to 8 M$\Omega$. The conductivity of the substrate material contributes to screening electrical fields generated in the apertures.

A suitable material for manufacturing the substrate may be chosen from a glass material as it is used for manufacturing a multi-channel plate for an image amplifier.

According to a further embodiment of the invention there is provided a particle-optical component having at least one multi-aperture plate having a plurality of beam-manipulating apertures formed therein for manipulating a charged-particle beamlet passing therethrough, wherein the plurality of beam-manipulating apertures is arranged in a predetermined array pattern.

Further, field correcting apertures are formed in the multi-aperture plate for correcting a distortion of the electrical field generated by the multi-aperture plate. Positions of the field correcting apertures in the array pattern of the beam-manipulating apertures and sizes and shapes of the field correcting apertures may be chosen such that the electrical field generated by the multi-aperture plate substantially corresponds to a desired electrical field upstream and/or downstream of the multi-aperture plate.

When the particle-optical component is used in a particle-optical system using a plurality of charged-particle beamlets, those beamlets will pass through the beam-manipulating apertures rather than through the field correcting apertures. This does not exclude, however, that intermediate beamlets pass through the field correcting apertures wherein the intermediate beamlets are removed by some other means from a bundle of charged-particle beamlets which the system intends to use. Such means for removing intermediate beamlets passing through the field correcting apertures may include beam stops arranged at suitable positions across the bundle of desired charged-particle beamlets. Such stop may be advantageously formed by a further multi-aperture plate having formed therein plural apertures which allow the desired beamlets to pass therethrough and having no apertures formed therein at positions corresponding to beam paths of the intermediate beamlets.

It is further possible to intercept the intermediate beamlets in the particle-optical component itself.

Herein, the stop may be advantageously formed by a bottom of an aperture-hole being not a through-hole of the plate.

When the beam-manipulating apertures are densely packed in the multi-aperture plate, the field correcting apertures have preferably a smaller size than the beam-manipulating apertures located adjacent thereto.

Further, when seen in a circumferential direction about a center of a given beam-manipulating aperture, the field correcting apertures are located circumferentially in-between other beam-manipulating apertures directly adjacent to the given beam-manipulating aperture.

According to a further embodiment of the invention there is provided a particle-optical component comprising, similar to the particle-optical components illustrated herein above, at least one multi-aperture plate having a plurality of beam-manipulating apertures formed therein. For compensating deviations of an electrical field generated by the multi-aperture plate from a desired electrical field, shapes of the beam-manipulating apertures may be designed such that additional shape features are added to basic shapes of the field manipulating apertures. The basic shapes are designed according to electron-optical design rules in view of providing a desired beam-manipulating effect on the beamlet passing through the aperture. For instance, the basic shape may be a circular shape for providing an effect of a round lens, or the basic shape may be an elliptical shape for providing an effect of an astigmatic lens.

The shape features are provided as radial recessions or protrusions in the basic shape. The shape features of a given aperture are provided at a manifold or symmetry around a circumference of the basic shape which corresponds to a manifold or symmetry of an arrangement of the beam-manipulating apertures in a surroundings of the given beam-manipulating beam aperture.

For instance, if a given beam-manipulating aperture has four immediately adjacent beam-manipulating apertures as closest neighbors, the shape features of the given beam-manipulating aperture will have a fourfold symmetry about a center of the given aperture for compensating for a non-rotational symmetric field configuration in a volume upstream or downstream of the given beam-manipulating aperture. Such non-rotational symmetric field configuration is caused by the symmetry of the beam-manipulating apertures located about the given aperture.

The closest neighbors about a given aperture may be determined by any method known from the art in other technical fields. According to one possible method a very closest neighbor to the given aperture is determined first by identifying that aperture among all other apertures different from the given aperture as very closest neighbor which is arranged at a minimum distance from the given aperture. Thereafter, all those apertures different from the given apertures are identified as closest neighbors which are arranged at a distance less than about 1.2 to about 1.3 times the minimum distance from the given aperture.

For determining a symmetry of the shape features it is also possible to examine a symmetry of a larger surroundings about a given aperture, for instance by performing a Fourier analysis on the first array pattern around the given aperture. The given aperture will then have a shape with at least one symmetry component corresponding to a symmetry of the first array pattern around the given beam-manipulating aperture. With this method also boundary effects of apertures close to a periphery of an aperture pattern may be taken into account where, for example, one half space about the given aperture may not be occupied by other apertures.

In a multi-aperture plate having a plurality of beam-manipulating apertures formed therein as a limited array pattern, the plate will extend beyond the pattern of beam-manipulating apertures. Thus, an electrical field generated by a region of the plate where no apertures are formed will be different from a field extending from a region where the aperture pattern is formed, resulting in an electrical field which deviates from a homogeneous electrical field or other desired electrical field in particular in a region close to a periphery of the pattern. At the periphery, optical properties provided by the apertures to the respective beams passing therethrough may be deteriorated as compared to optical properties provided by apertures located at a center of the pattern.

According to a further embodiment of the invention there is provided a particle-optical arrangement comprising, similar to the arrangements illustrated above, a multi-aperture plate having a plurality of beam-manipulating apertures formed therein for manipulating a plurality of charged-particle beamlets. The beam-manipulating apertures are arranged in a first array pattern and there are field correcting apertures formed in the multi-aperture plate in a region adjacent to the first array pattern.

The field correcting apertures may be arranged in an array forming an extension of the array pattern of the beam-manipulating apertures.

The beamlets which the particle-optical arrangement is intended to provide do not pass through the field correcting apertures. This does not exclude, however, that intermediate beamlets passing through the field correcting apertures are intercepted by some other means downstream of the field correcting aperture or within the field correcting aperture as described above.

According to a further embodiment of the invention there is provided a particle-optical arrangement comprising, similar to the arrangements described herein above, at least one charged-particle source, at least one multi-aperture plate having a plurality of apertures formed therein, a first voltage supply for supplying predetermined first voltages to the plurality of apertures, a first single-aperture plate arranged at a distance upstream or downstream from the multi-aperture plate, and a second voltage supply for supplying a predetermined second voltage to the first single-aperture plate.

The apertures in the multi-aperture plate are provided for manipulating charged-particle beamlets passing therethrough. A manipulating effect of the apertures is, amongst others, determined by an electric field generated by the multi-aperture plate upstream and/or downstream thereof. The single-aperture plate is provided upstream and downstream, respectively, to the multi-aperture plate for shaping the electrical field to a desired shape such that the manipulating effect of the apertures is varied across the aperture pattern according to a desired dependency.

According to an embodiment, the single-aperture plate is arranged at a distance less than 75 mm from the multi-aperture plate, preferably at a distance less than 25 mm and further preferred at a distance less than 10 mm or less than 5 mm.

According to a further embodiment, the single-aperture plate is arranged at a distance from the aperture which is less than one half, in particular one fourth, of a focal length which a lens function of the apertures of the multi-aperture plate provides to the beamlets passing therethrough.

According to still a further embodiment, the single-aperture plate is arranged at such a distance from the multi-aperture plate that an electric field on a surface of the multi-aperture plate is higher than 100 V/mm, higher than 200 V/mm, higher than 300 V/mm, higher than 500 V/mm, or higher than 1 kV/mm.

According to another embodiment, a distance between the multi-aperture plate and the first single-aperture plate is less than five times a diameter of the single aperture, less than three times the diameter of the single aperture, less than two times this diameter or even less than the diameter of the single aperture itself.

For providing a stronger dependency of the beam-manipulating effect of the plurality of apertures across the aperture array, it is preferred to provide a second single-aperture plate arranged in-between the multi-aperture plate and the first single-aperture plate. A third voltage supply is provided for supplying a predetermined third voltage to the second single-aperture plate. The third voltage may be chosen such that it is substantially equal to or lower than the average of the first voltages, or the third voltage may be chosen such that it is in-between the second voltage and the average of the first voltages.

A first single-aperture plate may be provided on both sides of the multi-aperture plate.

According to a further embodiment of the present invention there is provided a particle-optical arrangement comprising, similar to the arrangements described herein before, at least one charged-particle source for generating a beam of charged particles, and at least one multi-aperture plate having a plurality of apertures formed therein.

A first focusing lens is arranged in a beam path of the beam of charged particles in-between the charged-particle source and the multi-aperture plate. The first focusing lens has an effect of reducing a divergence of the beam of charged particles generated by the source for illuminating the plurality of apertures formed in the multi-aperture plate with charged particles. The charged-particle beam downstream of the first focusing lens may be either a divergent beam or a parallel beam. However, a divergence or parallelity of the beam should correspond to a desired divergence or parallelity to a high accuracy.

In practice, lens errors, such as an opening error or a chromatic error, contribute to a deviation from the desired divergence or parallelity.

A decelerating electrode for providing a decelerating electrical field in a region between the first focusing lens and the multi-aperture plate is provided for decelerating the charged particles after passing the first focusing lens to a desired kinetic energy for passing the multi-aperture plate. Thus, the kinetic energy of the charged particles passing the focusing field is higher than the desired kinetic energy of the charged particles passing the multi-aperture plate.

A possible advantage of such arrangement is a reduced contribution to a chromatic error of the first focusing lens at increased kinetic energies.

The inventors have found that a focusing effect of a multi-aperture plate having a plurality of apertures formed therein may be well controlled and relatively accurately adjusted even when a kinetic energy of the electrons penetrating the multi-aperture plate is high. This may reduce chromatic aberration of a charged-particle beamlet traversing a respective aperture.

Thus, according to a further embodiment of the invention, a kinetic energy of the electrons impinging on or traversing the multi-aperture plate may be higher than 5 keV, higher than 10 keV, higher than 20 keV or even higher than 30 keV.

According to a further embodiment, the invention provides a particle-optical arrangement comprising, similar to the arrangements described hereinabove, at least one charged-particle source, at least one multi-aperture plate, and a first focusing lens providing a focusing field in a region upstream and/or downstream of the multi-aperture plate. The particle-optical arrangement further comprises an energy changing electrode for changing a kinetic energy of charged particles of the beam in a second region upstream and/or downstream of the multi-aperture plate. In view of reducing errors induced by the first focusing lens, the first region where the focusing field is provided and the second region where the energy changing field is provided are overlapping regions.

According to an embodiment, the energy changing field is a decelerating electrical field for reducing the kinetic energy of the charged particles of the beam, and the overlapping regions are located substantially upstream of the multi-aperture plate.

According to a further embodiment, the energy changing field is an accelerating field for increasing the kinetic energy of the charged particles of the beam, and the overlapping regions are located substantially downstream of the multi-aperture plate.

An overlap between the energy changing field and the focusing field in the overlapping regions may be more than 1%, more than 5%, or more than 10%.

The overlap between the energy changing field and the focusing field may be determined by plotting both a field strength of the focusing field and a field strength of the energy changing field along a beam axis as respective curves in arbitrary units and normalized such that peak values of both curves are at a same level. An overlapping area under both curves divided by the total area below one or the other curve may then be taken as a measure for the overlap.

According to a further embodiment of the invention, there is provided a particle-optical arrangement comprising, similar to the arrangement described herein above, at least one charged-particle source, at least one multi-aperture plate, and a first focusing lens providing a focusing field in a region between the charged-particle source and the multi-aperture plate.

The first focusing lens is provided for reducing a divergence of the charged-particle beam generated by the source upstream of the multi-aperture plate such that the beam immediately upstream of the multi-aperture plate has a remaining divergence. In other words, a cross section of the beam when passing the first focusing lens is smaller than a cross section of the beam when impinging on the multi-aperture plate.

With such arrangement it is possible to illuminate apertures of a multi-aperture plate with a beam of a given cross section wherein the cross section of the beam passing the first focusing lens is smaller than the given cross section. This may have an advantage in that an opening error of the first focusing lens may be reduced as compared to a focusing lens collimating the beam for illuminating the given cross section to form a substantially parallel beam. According to some embodiments, a divergence of the beam immediately upstream of the multi-aperture plate may be higher than 0.5 mrad, higher than 1.0 mrad or even higher than 2 mrad, 5 mrad, or 10 mrad.

It should be noted, however, that, according to some embodiments, a convergent illumination of the multi-aperture plate is advantageous. Applications for such convergent illuminations may be, in particular, in the field of electron lithography. In practice, a distance between adjacent centers of the apertures formed in the multi-aperture plate is a limited distance which may not be further reduced. If such multi-aperture plate is illuminated with a parallel beam, also a distance of adjacent foci of the beamlets downstream of the multi-aperture plate will correspond to the distance between adjacent apertures in the multi-aperture plate. By illuminating the multi-aperture plate with a convergent beam it is, however, possible to reduce the distance between adjacent foci of the beamlet while maintaining the distance between adjacent apertures of the multi-aperture plate at a same. This allows to form a beam spot pattern in an object plane of the apparatus such that the beam spots have very low distances from each other, that they may contact each other or that they even overlap with each other.

Also a convergence of the illuminating beam may be in a range of higher than 0.5 mrad, higher than 1 mrad or even higher than 2 mrad.

According to a further embodiment of the invention, there is provided a particle-optical arrangement comprising, similar to the arrangement described herein before, at least one charged-particle source for generating a beam of charged particles, at least one multi-aperture plate having a plurality of apertures formed therein, and a first focusing lens providing a focusing field portion in a region between the charged-particle source and the multi-aperture plate. The first focusing lens provides a magnetic field, and the charged-particle source is arranged within the magnetic field provided by the first focusing lens. With such arrangement with the charged-particle source being immersed in the magnetic field a lens error provided by the focusing field portion may be reduced.

According to a preferred embodiment, the magnetic field portion in which the charged-particle source is provided is a portion with a substantially homogeneous magnetic field.

According to a further embodiment of the invention, there is provided a particle-optical arrangement comprising, similar to the arrangements illustrated herein before, at least one charged-particle source for generating a beam of charged particles, and at least one multi-aperture plate having a plurality of apertures formed therein, wherein a plurality of charged-particle beamlets is formed downstream of the at least one multi-aperture plate such that the respective charged-particle beamlets each form a focus in a focus region of the multi-aperture plate downstream thereof.

A second focusing lens provides a focusing field in the focus region wherein the focusing field has a focusing effect on the bundle of charged-particle beamlets. The second focusing lens may be necessary at some position downstream of the multi-aperture plate for some design reason according to which the particle-optical arrangement is designed. The position of the focusing field region of the second focusing field such that it coincides with the focus region of the multi-aperture plate may have an advantage in that an angular error of a respective beamlet at its focus, such as a chromatic error at the focus, has a reduced effect on the beamlet in a region downstream of the second focusing lens where an image of the focusing region is formed.

According to a further embodiment of the invention, there is provided a particle-optical arrangement comprising, similar to the arrangements illustrated herein before, at least one charged-particle source and at least one multi-aperture plate for focusing charged-particle beamlets to each have a focus in a focusing region of the multi-aperture plate downstream thereto.

An objective lens is provided for imaging the focusing region or an intermediate image thereof onto an object positionable in an object plane of the arrangement. By imaging foci of the charged-particle beamlets onto the object it is possible to obtain beam spots of comparatively low diameters on the object.

Further, the apertures in the at least one aperture plate may be provided with diameters substantially greater than diameters of the beamlets in a region of the foci. Thus, it is possible to form the small foci of the beamlets with comparatively large aperture diameters. A ratio of the total area of the apertures over the total area of the aperture pattern is also comparatively high. This ratio determines an efficiency of beamlet generation, i.e. a ratio of the total electron current of all beamlets over a total current of a beam illuminating the multi-aperture plate. Due to the large diameter apertures formed in the multi-aperture plate such efficiency will be comparatively high.

According to a further embodiment of the invention, there is provided an electron-optical arrangement providing a function of a beam path splitter and beam path combiner, respectively. The arrangement may provide a primary beam path for a beam of primary electrons directed from a primary electron source to an object which is positionable in an object plane of the arrangement, and a secondary beam path for secondary electrons originating from the object. The primary and secondary beam paths may be beam paths for single or plural beams of electrons. For applications as illustrated herein above, the primary and secondary beam paths are preferable beam paths for a plurality of electron beamlets, however.

The arrangement comprises a magnet arrangement having first, second and third magnetic field regions. The first magnetic field region is passed by both the primary and secondary electron beam paths and performs the function of separating those from each other. The second magnetic field region is arranged upstream of the first magnetic field region in the primary electron beam path and is not passed by the secondary electron path. The third magnetic field region is arranged in the secondary electron beam path downstream of the first magnetic field region and is not passed by the first electron beam path.

The first and second magnetic field regions deflect the primary electron beam in substantially opposite directions and the first and third magnetic field regions deflect the secondary electron beam path in a substantially same direction.

The arrangement has a low number of only three necessary magnetic field regions but may be still designed such that, for a given kinetic energy of the primary electrons and a given kinetic energy of the secondary electrons the arrangement provides electron-optical properties which are in first order stigmatic and/or in first order distortion free.

According to a preferred embodiment, a deflection angle of the second magnetic field region for the primary electron beam path is higher than a deflection angle of the first magnetic field region for the primary electron beam path. Herein, it is further preferred that an intermediate image is not formed in the primary electron beam path between the first and second magnetic field regions.

According to a further preferred embodiment, a first drift region, which is substantially free of magnetic fields, is provided in the primary electron beam path between the second and first magnetic field regions.

According to a further preferred embodiment, a second drift region, which is substantially free of magnetic fields, is provided in the secondary electron beam path between the first and third magnetic field regions. It is, however, also possible, that substantially no second drift region is provided in the secondary electron beam path between the first and third magnetic field regions. If both the first and second drift regions are provided, it is then preferred that the second drift region is substantially shorter than the first drift region.

According to a further preferred embodiment, a focusing lens is provided in-between of the first magnetic field region and the object plane, wherein the focusing lens is passed by both the primary and secondary electron beam paths. In view of an application of an electron microscope the focusing lens may be embodied as an objective lens.

Herein, it is further preferred that at least one electrode is provided in both the first and second electron beam paths for decelerating the primary electrons before impinging on the object and for accelerating the secondary electrons after emerging from the object. With such electrode it is possible to change a kinetic energy with which the primary electrons impinge on the object while the kinetic energy of the primary electrons passing the magnet arrangement is maintained at a same value. Thus, it is possible to maintain the electron-optical properties of the beam path splitter/combiner at substantially same electron-optical properties while it is possible to change the kinetic energy of the primary electrons impinging on the object. A high accuracy of focusing the primary electrons on the object is achievable over a comparatively large range of kinetic energies of the primary electrons impinging on the object, accordingly.

Herein, it is further preferred that the magnet arrangement comprises a fourth magnetic field region in the secondary electron beam path downstream of the third magnetic field region, wherein a magnetic field strength in the third magnetic field region is adjustable relative to a magnetic field strength in the first magnetic field region. The field strength in the fourth magnetic field region may be adjusted in dependence of the voltage supplied to the pair of electrodes. Since a change of the voltage supplied to the pair of electrodes changes the kinetic energy of the secondary electrons entering the magnet arrangement, the deflection angle of the first magnetic field region for the secondary electron beam path will also change. The possibility to adjust the field strength in the third and fourth magnetic field regions provides the possibility to compensate for such changes on the secondary electron beam path caused by changes of the voltage supply to the pair of electrodes. In fact, the fourth magnetic field region may provide a function of a compensating deflector.

Further, the change of kinetic energies of the secondary electrons entering the magnet arrangement may result in a change of a quadrupole effect on the secondary electron beam path and caused by the first and third magnetic field regions. Preferably, at least one electron-optical component for compensating such change in the quadrupole effect is also provided in the secondary electron beam path. Such compensating component may be provided by one or two additional magnetic field regions provided in the secondary electron beam path, or one or two quadrupole lenses provided in the secondary electron beam path, or combinations of additional field regions and quadrupole lenses provided in the secondary electron beam path.

According to a preferred embodiment there is provided a fifth magnetic field region in the secondary electron beam path downstream of the fourth magnetic field region, and a quadrupole lens downstream of the fifth magnetic field region. A field strength provided by the quadrupole lens and/or the fifth magnetic field region is preferably adjustable in dependence of the voltage supplied to the at least one electrode.

According to a further preferred embodiment, an intermediate image of the object plane is formed by the secondary electrons in a region comprising the first, third, fourth and fifth magnetic field regions.

BRIEF DESCRIPTION OF THE DRAWINGS

The forgoing as well as other advantageous features of the invention will be more apparent from the following detailed description of preferred embodiments of the invention with reference to the accompanying drawings.

FIG. 16 illustrates an effect of a field curvature caused by electron-optical components involved in imaging a focus plane onto an object;

FIG. 17 illustrates a multi-aperture arrangement suitable for compensating a field curvature as illustrated in FIG. 16;

FIG. 18 shows an elevational view on a multi-aperture pattern for compensating a field curvature;

DETAILED DESCRIPTION OF EXEMPLARY EMBODIMENTS

Figure 1:
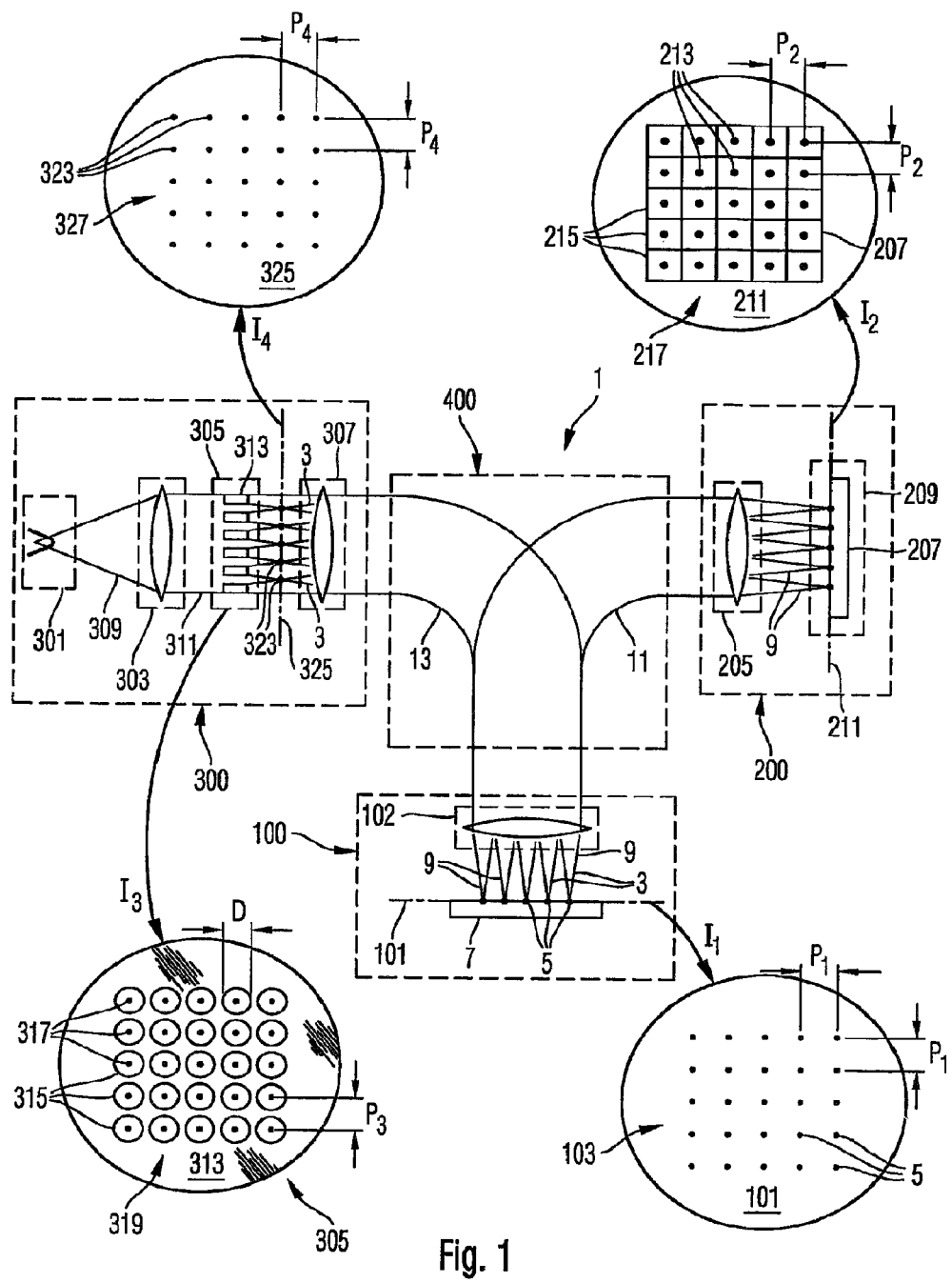
FIG. 1 schematically illustrates basic features and functions of an electron microscopy system according to an embodiment of the invention.

In the exemplary embodiments described below, components that are similar in function and structure are designated as far as possible by similar reference numerals. Therefore, to understand the features of the individual components of a specific embodiment, the descriptions of other embodiments and of the summary of the invention should be referred to.

FIG. 1 is a schematic diagram symbolically illustrating basic functions and features of an electron microscopy system 1. The electron microscopy system 1 is of a scanning electron microscope type (SEM) using a plurality of primary electron beamlets 3 for generating primary electron beam spots 5 on a surface of an object 7 to be inspected which surface is arranged in an object plane 101 of an objective lens 102 of an objective arrangement 100.

Insert $I_1$ of FIG. 1 shows an elevational view on object plane 101 with a regular rectangular array 103 of primary electron beam spots 5 formed thereon. In FIG. 1 a number of 25 primary electron beam spots 5 arranged in a 5×5-array 103 is shown. This number of primary electron beam spots is a low number for ease of illustrating the principles of the electron microscopy system 1. In practice, the number of primary electron beam spots may be chosen substantially higher, such as 30×30, 100×100 or others.

In the illustrated embodiment the array 103 of primary electron beam spots 5 is a substantially regular rectangular array with a substantially constant pitch $P_1$ in a range of 1 μm to 10 μm. It is, however, also possible that the array 103 is a distorted regular array or an irregular array or an array of some other symmetry, such as a hexagonal array.

A diameter of the primary electron beam spots formed in the object plane 101 may be in a range of 5 nm to 200 nm. The focusing of the primary electron beamlets 3 to form the primary electron beam spots 5 is performed by the objective arrangement 100.

The primary electrons incident on the object 7 at the beam spots 5 generate secondary electrons emanating from the surface of object 7. The secondary electrons form secondary electron beamlets 9 entering the objective lens 102.

The electron microscopy system 1 provides a secondary electron beam path 11 for supplying the plurality of secondary electron beamlets 9 to a detecting arrangement 200. Detecting arrangement 200 comprises a projecting lens arrangement 205 for projecting the secondary electron beamlets 9 onto a surface plane 211 of an electron sensitive detector 207 of a detector arrangement 209. The detector 207 can be one or more selected from a solid state CCD or CMOS, a scintillator arrangement, a micro channel plate, an array of PIN diodes and others.

Insert $I_2$ of FIG. 2 shows an elevational view on image plane 211 and the surface of detector 207 where secondary electron beam spots 213 are formed as an array 217. A pitch $P_2$ of array may be in a range of 10 μm to 200 μm. The detector 207 is a position sensitive detector having a plurality of detecting pixels 215. The pixels 215 are arranged in an array matching with array 217 formed by the secondary electron beam spots 213 such that each pixel 215 can detect an intensity of the secondary electron beamlet 9 associated therewith.

The primary electron beamlets 3 are generated by a beamlet generating arrangement 300 comprising an electron source arrangement 301, a collimating lens 303, a multi-aperture plate arrangement 305 and a field lens 307.

The electron source arrangement 301 generates a diverging electron beam 309 which is collimated by collimating lens 303 to form a beam 311 for illuminating multi-aperture arrangement 305.

Insert $I_3$ of FIG. 1 shows an elevational view of multi-aperture arrangement 305. Multi-aperture arrangement comprises a multi-aperture plate 313 having a plurality of apertures 315 formed therein. Centers 317 of apertures 315 are arranged in a pattern 319 which electron-optically corresponds to pattern 103 of the primary electron beam spots 5 formed in object plane 101.

A pitch $P_3$ of array 319 may be in a range of 5 μm to 200 μm. Diameters D of apertures 315 may be in a range of $0.2 \times P_3$ to $0.5 \times P_3$, a range of $0.3 \times P_3$ to $0.6 \times P_3$, a range of $0.4 \times P_3$ to $0.7 \times P_3$, a range of $0.5 \times P_3$ to $0.7 \times P_3$, a Range of $0.5 \times P_3$ to $0.6 \times P_3$, a Range of $0.6 \times P_3$ to $0.7 \times P_3$, a range of $0.7 \times P_3$ to $0.8 \times P_3$, and/or $0.8 \times P_3$ to $0.9 \times P_3$.

Electrons of illuminating beam 311 passing through apertures 315 form the primary electron beamlets 3. Electrons of illuminating beam 311 impinging on plate 313 are intercepted from a primary electron beam path 13 and do not contribute to form the primary electron beamlets 3.

As illustrated so far, it is one function of the multi-aperture arrangement 305 to form the plurality of primary electron beamlets 3 from the illuminating beam 311. One further function of the multi-aperture arrangement is to focus each primary electron beamlet 3 such that foci 323 are generated in a focus region or focus plane 325.

Insert $I_4$ of FIG. 1 shows an elevational view of focus plane 325 with foci 323 arranged in a pattern 327. A pitch $P_4$ of this pattern may be a same or different from pitch $P_3$ of pattern 319 of multi-aperture plate 313 as will be understood from the following specification. A diameter of foci 323 may be in a range of 10 nm to 1 μm.

Field lens 307 and objective lens 102 together perform a function of imaging focus plane 325 onto object plane 101 to form the array 103 of primary electron beam spots 5 of a low diameter on the object 7 for achieving a high resolution of secondary electron images generated by detecting intensities of the secondary electron beamlets 9 by detector arrangement 209.

A beam splitter/combiner arrangement 400 is provided in the primary electron beam path 313 in-between the beamlet generating arrangement 300 and objective arrangement 100 and in the secondary electron beam path 11 in-between the objective arrangement 100 and the detecting arrangement 200.

FIG. 2 shows cross sections of some of a plurality of possible embodiments of multi-aperture arrangement 305.

Figure 2A:
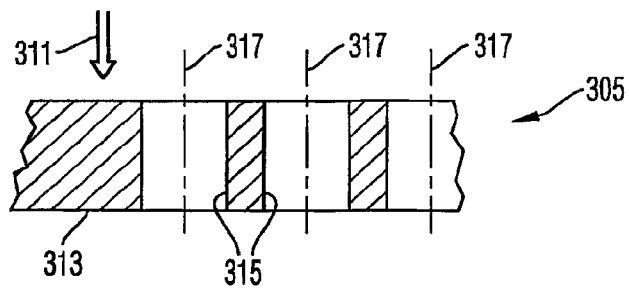
FIGS. 2*a*-2*d* show schematic sections through variants of multi-aperture arrangements which may be used in the electron microscopy system according to FIG. 1.

FIG. 2a shows a multi-aperture arrangement 305 having one single multi-aperture plate 313 with plural apertures 315 formed therein. Such single multi-aperture plate 313 may perform both the functions of generating the primary electron beamlets 3 from an illuminating beam 311 and of focusing the primary electron beamlets 3 downstream of multi-aperture plate 313. A focus length f provided by each aperture 315 may be estimated according to the formula $$f = -4\frac{U}{\Delta E},$$

wherein
U is the kinetic energy of electrons passing multi-aperture plate 313 and
ΔE represents a difference in electric field strengths provided upstream and downstream of multi-aperture plate 313.

Figure 2B:
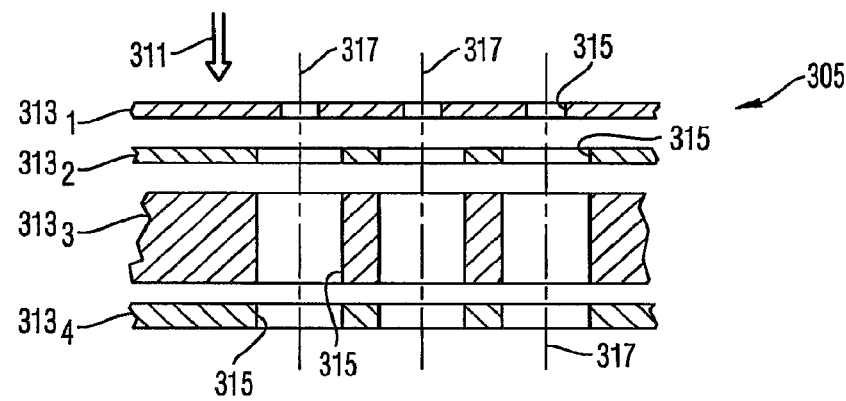

FIG. 2b shows a multi-aperture arrangement 305 having four multi-aperture plates $313_1$, $313_2$, $313_3$, $313_4$ arranged spaced apart from each other in a direction of the primary electron beam path 13. Each of the multi-aperture plates $313_1$, . . . , $313_4$ has a plurality of apertures 315 formed therein wherein the apertures 315 are centered with respect to common central axis 317 extending in a direction of the primary electron beam path.

Multi-aperture plate $313_1$ is illuminated by illuminating beam 311, and the apertures 315 formed therein are of a diameter for selecting and generating the primary electron beamlets from the illuminating beam 311. Plate $313_1$ may be supplied with an electrical voltage substantially equal to a potential or kinetic energy of the electrons of the illuminating beam 311.

The apertures 315 formed in each of plates $313_2$, $313_3$, $313_4$ are of an equal diameter larger than the diameter of apertures 315 formed in illuminated plate $313_1$. Plates $313_2$ and $313_4$ are thin plates and plate $313_3$ has a higher thickness than plates $313_2$ and $313_4$. Equal voltages may be supplied to plates $313_2$ and $313_4$, and a voltage different therefrom may be supplied to plate $313_3$, such that a function of an Einzel-lens is performed on each primary electron beamlet selected by illuminated plate $313_1$.

Figure 2C:
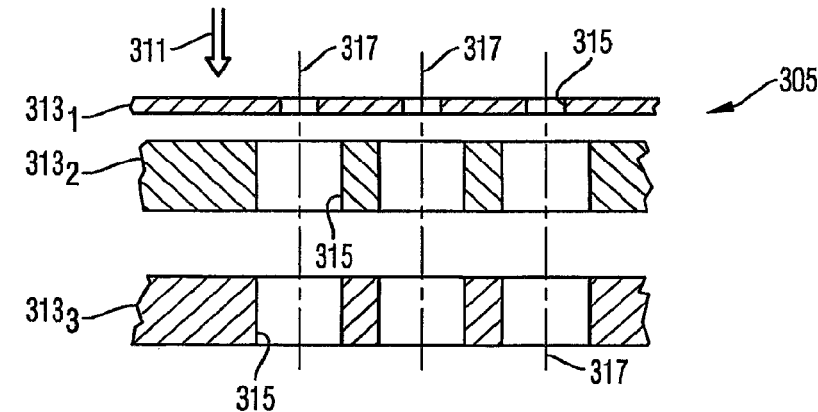

FIG. 2c shows a multi-aperture arrangement 305 having an illuminated multi-aperture plate $313_1$ with small diameter apertures 315 for selecting primary electron beamlets formed therein. Two multi-aperture plates $313_2$ and $313_3$ having a greater thickness than illuminated aperture $313_1$ are provided downstream of illuminated multi-aperture plate $313_1$ for performing a function of an immersion lens on each primary electron beamlet. Different voltages will then be supplied to plates $313_2$ and $313_3$ for achieving the focusing function of the multi-aperture arrangement 305 during operation thereof.

Figure 2D:
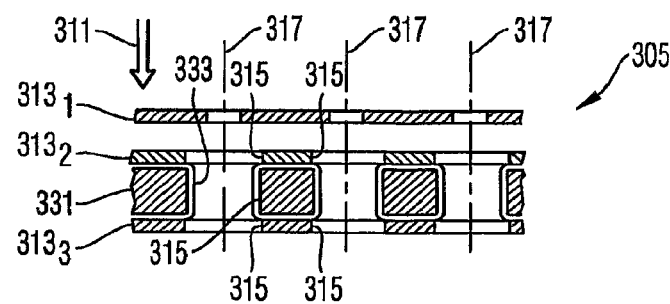

FIG. 2d shows a variant of the immersion lens type multi-aperture arrangement shown in FIG. 2c. The arrangement shown in FIG. 2c may have a disadvantage in that electrical fields generated along a given axis 317 due to the different voltages applied to plates $313_2$, $313_3$ will be effected by stray fields of corresponding fields generated along directly adjacent or more distant axes 317. These stray fields will usually not have a rotational symmetry about given axis 317 such that the function of the round lens provided by the immersion lens arrangement is adversely effected.

The multi-aperture arrangement 305 of FIG. 2d has an insulating spacer 331 sandwiched between multi-aperture plates $313_2$ and $313_3$ wherein a conductive layer 333 covers an interior of apertures 315 in insulating spacer 331.

The conductive layer 315 is sufficiently conductive for performing a screening function for generating stray fields and for screening remaining stray fields generated by adjacent apertures.

According to an embodiment, the arrangement 305 of FIG. 2d may be manufactured as follows: a plate-shaped silicon substrate is provided as the insulating spacer 331; a silicon oxide layer is formed on both the upper and lower surfaces of the plate; upper $313_2$ and lower $313_3$ metal layers are deposited on the upper and lower silicon oxide layer, respectively; a resist pattern defining the apertures 315 is provided on the upper metal layer $313_2$; apertures 315 are formed in the upper metal layer $313_2$ by metal etching, using a conventional etching agent; corresponding apertures are formed in the upper silicon oxide layer by silicon oxide etching, using a conventional etching agent; apertures 315 are formed in the silicon substrate by silicon etching, using a conventional etching agent; corresponding apertures are formed in the lower silicon oxide layer by silicon oxide etching; apertures 315 are formed in the lower metal layer $313_3$ by metal etching to finally form a through-hole through the structure of the silicon substrate and the silicon oxide and metal layers provided thereon. Subsequently an oxidation process is performed for depositing an oxide layer on the surfaces of the upper $313_2$ and lower $313_3$ metal layers, and for depositing an oxide layer on the interior wall of the through-hole. Finally, a resistive layer is deposited on the oxide layer deposited on the interior wall of the through-hole. A sputtering process may be used for depositing the resistive layer. The resistive layer is deposited such that a resistance between upper $313_2$ and $313_3$ metal layer is in a range of 250Ω to 8 MΩ A rapid thermal oxidation (RTO) process or an electrochemical oxidation process may be used for depositing the oxide layer.

Figure 3:
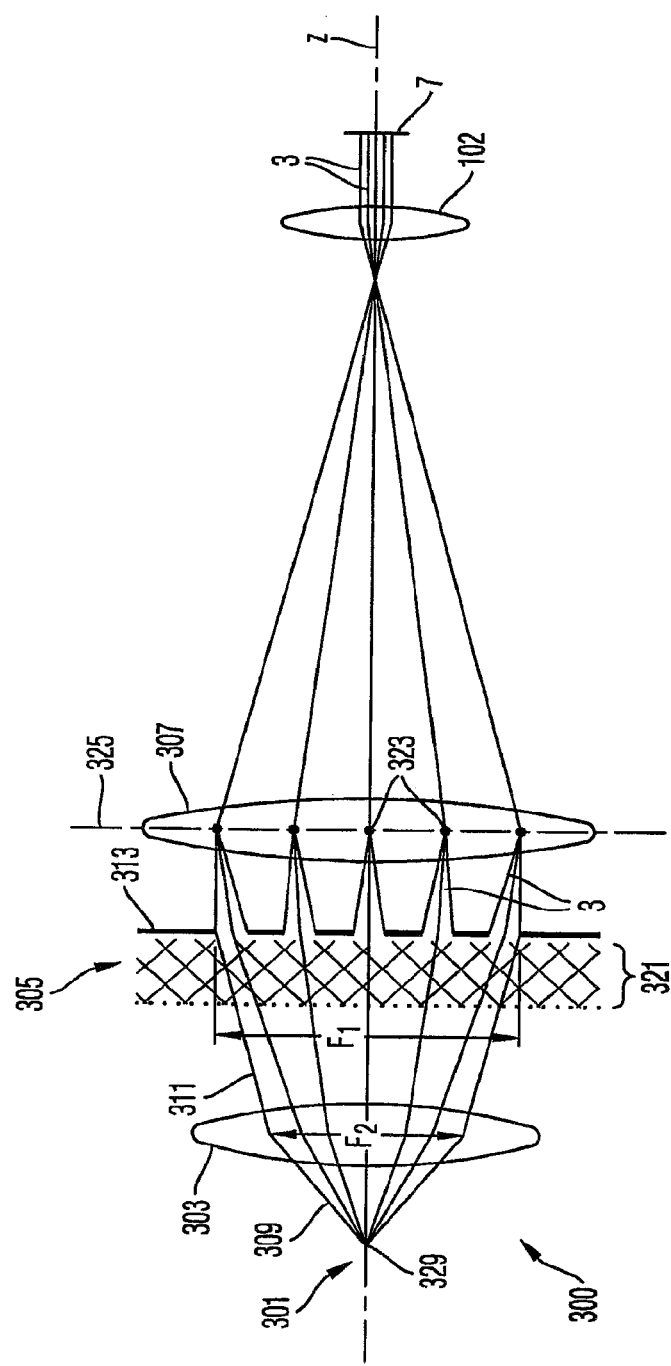
FIG. 3 is a schematic diagram for illustrating electron-optical components for illuminating a multi-aperture arrangement and for manipulating beamlets of electrons generated by the multi-aperture arrangement.

FIG. 3 is a further schematic diagram of an embodiment of beamlet generating arrangement 300.

As shown in FIG. 3, an electron source arrangement 301 generates a highly divergent electron beam 309 originating from a virtual source 329. In the illustrated embodiment, the electron source is of a thermal field emission (TFE) type having an angular intensity of 1 to 3 mA/sr and an emission half angle of 100 mrad.

A collimating lens 303 is arranged in a beam path of divergent beam 309 and has a focusing power such that highly divergent beam 309 is transformed to an illuminating beam 311 of a reduced divergence. Divergent illuminating beam 311 then illuminates an illuminated region $F_1$ of a multi-aperture plate 313 of multi-aperture arrangement 305. The illumination of multi-aperture plate 313 with diverging beam 311 has the following advantages over an illumination of region $F_1$ with a parallel beam:

A cross section $F_2$ traversed by the beam 309, 311 in collimating lens 303 is substantially smaller than the illuminated area $F_1$. A collimating lens of a reduced diameter may be used as compared to an illumination with the parallel beam, thus reducing opening errors introduced by collimating lens 303. Further, a focusing power of collimating lens 303 may be reduced as compared to a focusing lens for transforming divergent beam 309 to a parallel beam which also contributes to reducing errors introduced by collimating lens 303.

Further, a decelerating electric field region 321 indicated by a cross-hatched area in FIG. 3 is provided upstream of multi-aperture plate 313. The electrons of illuminating beam 311 are decelerated in decelerating field region 317 to a desired kinetic energy designed such that foci 323 of the primary electron beamlets 3 are formed in a focus plane 325 downstream of multi-aperture arrangement 305. As a consequence the primary electrons have a higher kinetic energy when passing collimating lens 303 such that a chromatic error (ΔE/E) of collimating lens 303 may also be reduced.

Field lens 307 is arranged such that a location of a focusing effect thereof coincides with focus plane 325 or the focus region where the foci 323 of the primary electron beamlets 3 are formed by the multi-aperture arrangement 305. This has an advantage that a lens error, such as a chromatic error, of field lens 307 has a reduced effect on the primary electron beam spots 5 formed on object 7 arranged in object plane 101. Such chromatic error of field lens 307 will result in an angular error of electron beams starting at foci 323. Since, however, the foci 323 are imaged onto the object 7 such angular errors will have no effect, and also electron beams starting with an angular error from foci 323 will hit the object plane substantially at a correct image position corresponding to a position of the respective 323. The angular error generated by field lens 307 will then only effect a landing angle of the primary electron beamlets 3 at the primary electron beam spots 5 formed on the object 7. Positions of the beam spots are not effected by such error.

Figure 4:
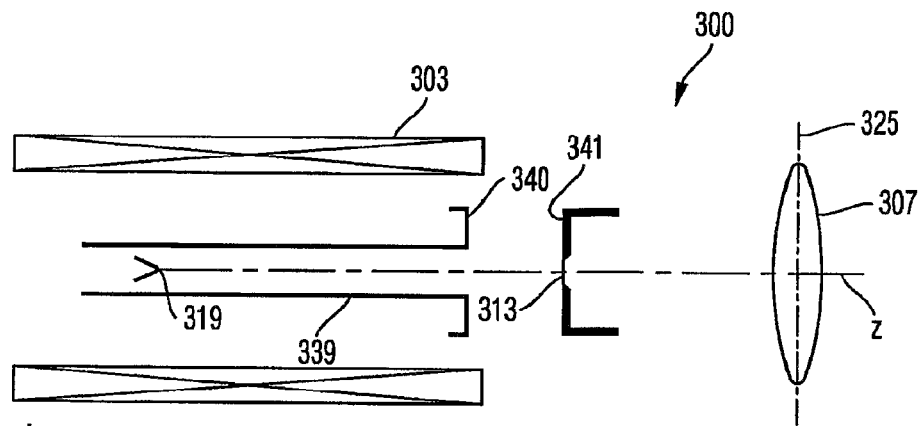
FIG. 4 shows an example of a primary electron beamlet generating arrangement which may be used in the electron microscopy system of FIG. 1.

FIG. 4 schematically illustrates a further variant of a structure of a primary electron beamlet generating arrangement 300. A virtual source 319 is arranged on a z-axis in a beam liner tube 339 having a downstream end flange 340. A multi-aperture plate 313 is mounted in a center of a cup-shaped electrode 341. The electrons are extracted from source 319 with a voltage of 30 kV and between flange 340 and electrode 341 a retarding field of about 350 V/mm is generated upstream of multi-aperture plate 313.

Figure 5:
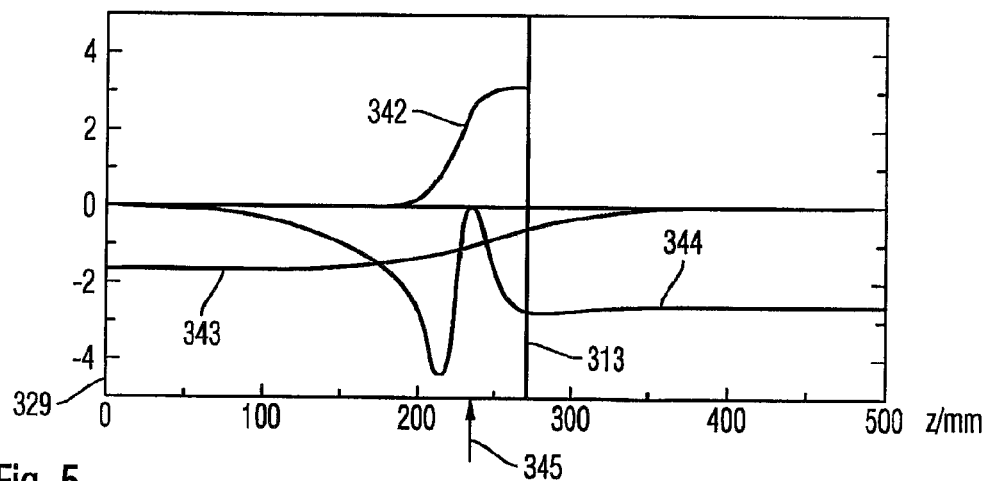
FIG. 5 shows plural physical properties of a beam path provided by the arrangement as shown in FIG. 4.

FIG. 5 shows some physical properties of the arrangement 300 of FIG. 4 plotted along the z-axis in arbitrary units. A curve 342 indicates the decelerating electrical field generated between electrodes 340, 341. In FIG. 5 the source 319 is located at z=0 mm and the multi-aperture plate is located at z=270 mm.

The source 319 is immersed in a magnetic field of collimating lens 303. A curve 343 in FIG. 5 shows the magnetic field strength oriented in z-direction and generated by collimating lens 303 in dependence of the position along the z-axis. As can be seen from FIG. 5, the source 319 is located in a portion of the field generated by the lens where $B_z$ is substantially constant. Such constant magnetic field has only a low focusing effect and a very low aberration on the electrons emitted from the source 319. The main focusing effect is achieved at those portions of the magnetic field $B_z$ where the same has a substantial gradient. From FIG. 5 it appears that the focusing function of collimating lens 303 is provided at z-positions from about 200 mm to 300 mm. The focusing power of collimating lens 303 coincides with the decelerating electrical field 342 generated by electrodes 340, 341. Such coinciding focusing magnetic field and decelerating electrical field allows to provide a focusing function on the primary electron beam while maintaining optical errors introduced therewith at a low level. This is evident from a line 344 shown in FIG. 5 indicating the development of a chromatic error $C_s$ of the optical arrangement along the z-axis. $C_s$ is zero at z=0 and increases with increasing values of z. Due to the overlapping magnetic and electrical field regions it is possible to reduce $C_s$ to a value close to zero at a position 345 at about z=230 mm. Downstream of this position 345 $C_s$ then continuously increases again.

Figure 6:
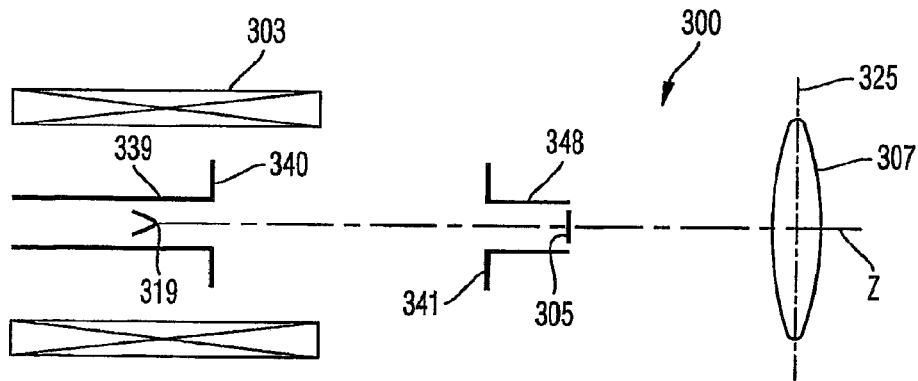
FIG. 6 shows an example of a primary electron beamlet generating arrangement which may be used in the electron microscopy system of FIG. 1.

FIG. 6 shows a further variant of a primary electron beamlet generating arrangement 300 having a electron source 319 immersed in a constant portion of a magnetic field of a collimating lens 303 and within a beam tube 339 having a downstream flange electrode 340. Electrode 340 is opposite to an electrode 341 provided as an upstream flange of a further beam tube 348. A multi-aperture arrangement 305 is provided in beam tube 348 close to a downstream end thereof. Between electrodes 340 and 341 a decelerating electrical field is generated which overlaps with a focusing gradient magnetic field generated by collimating lens 303.

At a surface of multi-aperture arrangement a remaining electrical field is relatively small.

The multi-aperture arrangement 305 generates a plurality of primary electron beamlets (not shown in detail in FIG. 6) each having a focus in a focus plane 325.

Figure 7:
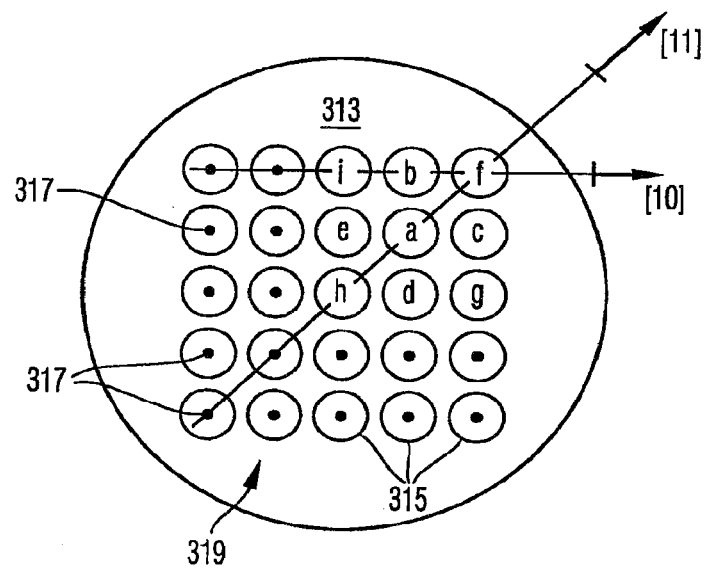
FIG. 7 shows an array pattern of apertures formed in a multi-aperture plate.

FIG. 7 shows a pattern 319 of apertures 315 formed in a multi-aperture plate 313, similar to insert $I_3$ of FIG. 1. Each non-periperhal aperture "a" has four directly neighboring apertures "b", "c", "d" and "e", and it has four second closest neighboring apertures "f", "g", "h" and "i". FIG. 7 indicates a basic array vector [10] in which apertures 315 are arrayed at the closest neighbor pitch, and FIG. 7 indicates a basic array vector [11] in which the apertures 315 are arrayed with a second closest neighbor pitch. From FIG. 7 it can be seen that stray fields generated by apertures "b" through "i" adjacent to given aperture "a" have a fourfold symmetry about a center 317 of the given aperture. These stray fields will cause a distorting effect on the focusing performance on the beamlet which passes through given aperture "a".

Figure 8:
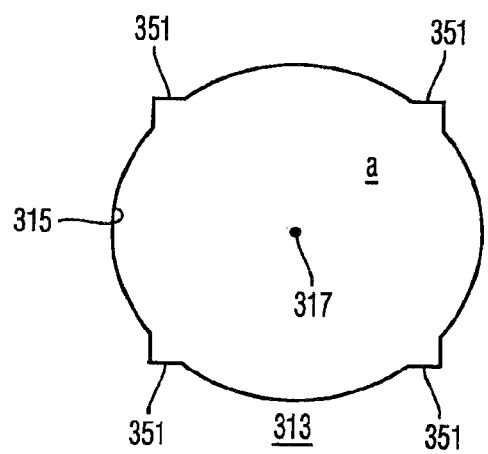
FIG. 8 is a detailed view of a shape of an aperture having additional shape features for compensating a multipole effect caused by the pattern arrangement of apertures as shown in FIG. 7.

FIG. 8 illustrates an embodiment for correcting such multipole stray fields generated by apertures adjacent to given aperture "a". Aperture "a" has a basic circular shape wherein additional features having a fourfold symmetry are arranged about center 317 of given aperture "a" are provided about "a" circumference of aperture "a". The additional features are formed as shaped protrusions 351 of the aperture into plate 313. Additional features 351 have an influence on stray fields generated by the apertures provided with the additional features. The additional features are designed such that, if the same are provided to each of apertures "a" through i, a multipole component of the stray fields generated with respect to given aperture "a" are reduced.

The additional features having the same symmetry as the closest neighbors of a given aperture may be provided at an aperture of any basic shape. For instance, the basic shape may be circular, elliptical or of some other shape.

Figure 9:
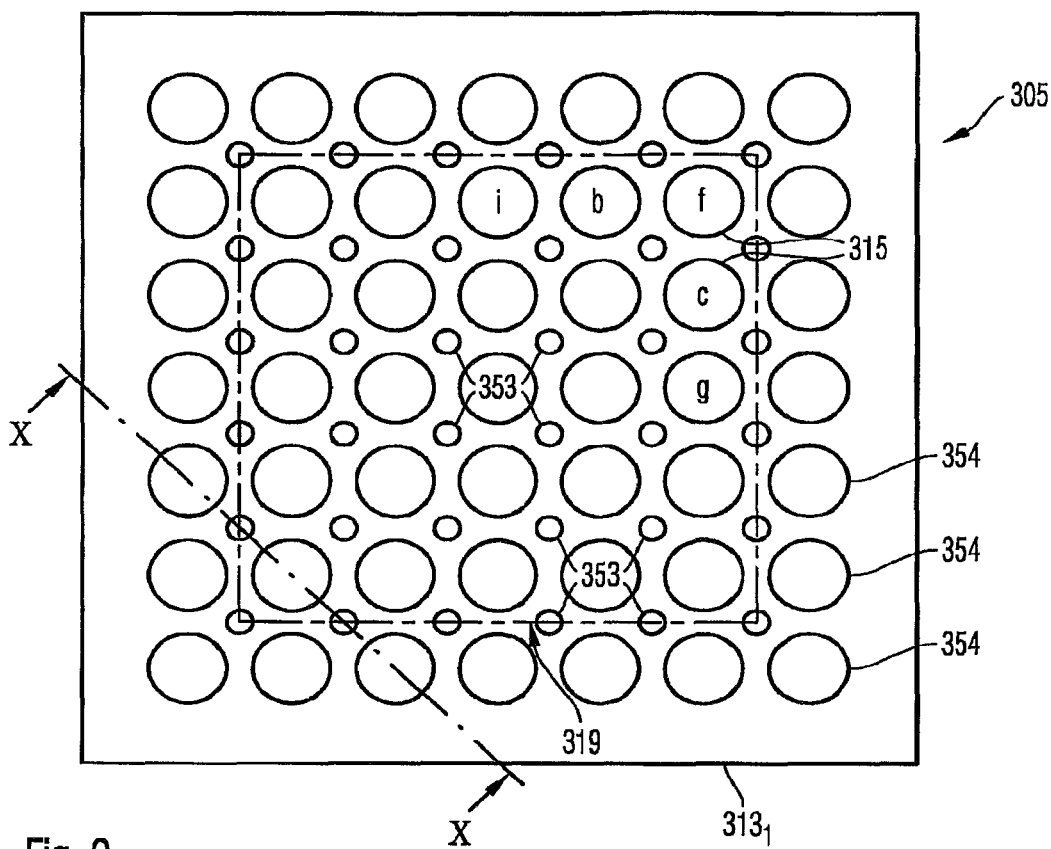
FIG. 9 shows an arrangement of apertures and field correcting apertures provided in a multi-aperture plate.

FIG. 9 shows a further embodiment of reducing an effect of stray fields having a multipole characteristic. Again, apertures 315 are arranged in a rectangular regular array pattern 319. Apertures 315 (5×5-apertures in the example of FIG. 9) are involved in manipulating electron beamlets passing therethrough. At interstitial positions between apertures 315 smaller field correcting apertures 353 are formed. The field correcting apertures 353 also form a rectangular regular grid of a same pitch as grid 319. The grid of the field correcting apertures 353 is displaced from grid 319 of the apertures by one half of a pitch.

A diameter of the field correcting apertures 353 is determined such that a multipole characteristic of stray fields generated by both the apertures 315 and the field correcting apertures 353 is reduced as compared to the situation shown in FIG. 7 where no field correcting apertures 353 are provided.

Figure 10:
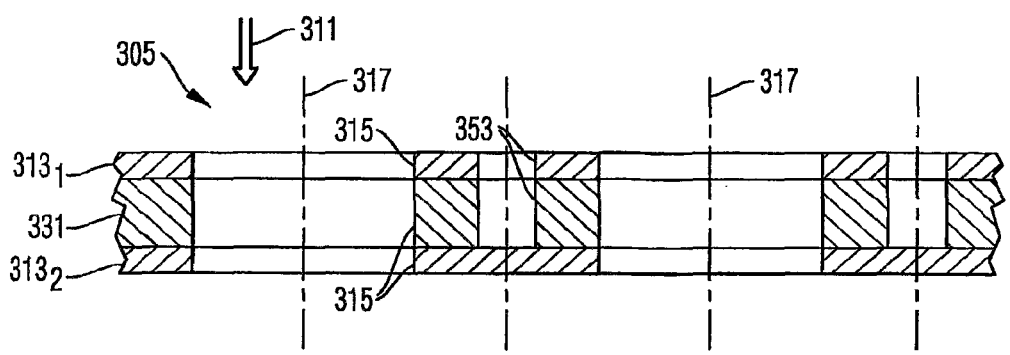
FIG. 10 is a cross section of the plate as shown in FIG. 9 along a line X-X indicated therein.

FIG. 10 shows a cross section through the multi-aperture arrangement 305 shown in FIG. 9. The multi-aperture arrangement 305 comprises an insulating spacer 331 sandwiched between two multi-aperture plates $313_1$ and $313_2$. The apertures 315 are formed as through-holes through all of the multi-aperture plates $313_1$, $313_2$ and the insulating spacer 331, whereas the field correcting apertures 353 are only formed in the upper multi-aperture plate $313_1$ exposed to an illuminating electron beam 311, and in the insulating spacer 331. The multi-aperture plate $313_2$ does not have apertures formed at those positions corresponding to positions of apertures 353 formed in the upper multi-aperture plate $313_1$ and in the insulating spacer 331.

According to an embodiment, the multi-aperture arrangement 305 shown in FIG. 10 may be manufactured by a method such as a lithographic process wherein a substrate, such as a mono-crystalline silicon substrate having a surface oriented in a (110) lattice plane of the substrate, forming insulating spacer 331 is provided on both surfaces thereof with a metallization layer forming multi-aperture plates $313_1$ and $313_2$, respectively. A resist pattern defining the apertures 315 is provided on metallization layer $313_1$, and a first etching step is performed with a conventional first etching agent which etches metal; a second etching step is performed with a conventional second etching agent which etches silicon, and a third etching step is performed with the first etching agent to form the through-holes of apertures through all of the layers $313_1$, 331 and $313_2$. Thereafter, the resist pattern corresponding to the pattern of the field correcting apertures 353 is provided on plate $313_1$ and etching is performed with the first etching agent through upper layer $313_1$. Thereafter, etching is continued with the second etching agent which etches only silicon and does not etch metal. Thus, apertures 353 are formed through silicon substrate 331, and etching is stopped at the bottom of apertures 353 in the silicon substrate; lower metal layer 313$_2$ has a function of an etch stop, accordingly.

A multi-aperture component as shown in one of FIGS. 2a, 2b, 2c, 2d and in FIG. 10 may be obtained, for example, from Team Nanotec GmbH, 78052 Villingen-Schwenningen, Germany.

Now reference is made to FIG. 7 again.

The central aperture of the aperture array 319 is surrounded by two rows of further apertures adjacent thereto at upper, lower, left and right sides. In contrast thereto central peripheral aperture "g" does not have any adjacent apertures at its right side, and upper peripheral aperture "f" does not have adjacent apertures provided at its upper and right sides.

The surrounding electrical field will be different for central aperture "h", central peripheral aperture "g" and upper peripheral aperture "f". Thus, apertures "h", "g" and "f" will have different beam-manipulating effects on the respective beamlets passing therethrough. Such differences will be particularly increased for apertures close to a periphery of pattern 319 of the beam-manipulating apertures.

FIG. 9 shows one embodiment of the invention that reduces such influences on peripheral beam-manipulating apertures. The array 319 (5×5-apertures in the illustrated example) is surrounded by additional apertures 354. In FIG. 9 one row of additional apertures 354 is formed around a periphery of array pattern 319. It is, however, possible to provide two or more rows of additional apertures 354 around the periphery of array 319. The additional apertures 354 have an effect that the peripheral apertures "i", "b", "f", "c", "g" of the array pattern 319 have adjacent apertures on all of the upper, lower, left and right sides, thus reducing the periphery effect illustrated above.

The additional apertures 354 may be arranged as a continuation of pattern 319, i.e. they are provided with a same pitch as array 319, and the additional apertures 354 have the same diameters as those apertures "i", "b", "f", "c", "g", . . . located at the periphery of array 319. It is, however, possible to provide the additional apertures 354 with some other pattern and diameters around the periphery of the pattern 319 of apertures 315.

The additional apertures 354 may be formed in a similar manner to the field correcting apertures 353, i.e. not formed as through-holes through the multi-aperture arrangement 305 as indicated in FIG. 10. Thus, there will be no primary electron beamlets emerging from the additional apertures 354. It is, however, also possible to form the additional aperture 354 as through-holes through the multi-aperture arrangement 305 such that also the additional apertures 354 generate primary electron beamlets downstream thereof. The beamlets formed by the additional apertures 354 may then be intercepted by some other means, such as a suitable stop, provided downstream of the multi-aperture arrangement. It will be also possible to form the illuminating beam 311 such that only the pattern 319 of the apertures 315 is illuminated with the illuminating beam and such that the additional apertures 354 will not be illuminated by the illuminating beam 311.

Figure 11:
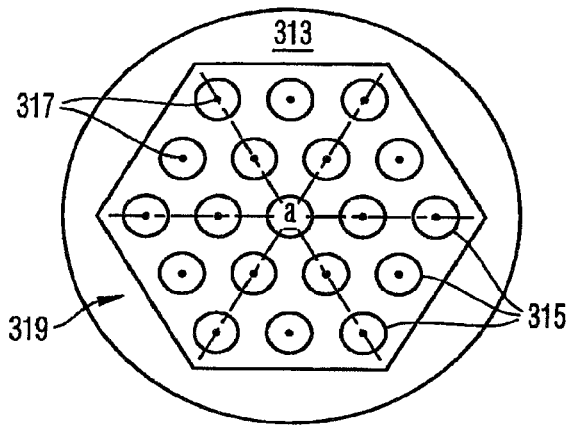
FIG. 11 shows a hexagonal array pattern of apertures.

FIG. 11 shows, similar to FIG. 7, an elevational view on a multi-aperture plate 313 having a plurality of beam-manipulating apertures 315 formed therein. The apertures 315 are arranged in an array 319 which is a regular hexagonal array (like honeycomb). A given aperture "a" is surrounded by six closest neighboring apertures 315 such that stray fields caused by the surrounding apertures at a position of the given apertures have a sixfold symmetry. Compared to the rectangular array of FIG. 7 having a fourfold symmetry, the sixfold symmetry is of a higher order such that the multipole effect of stray fields generated in the hexagonal array are substantially reduced when compared to the rectangular array.

Reference is now made to FIG. 1 again.

FIG. 1 is a schematic and idealized sketch for illustrating the main functions of the electron microscopy system 1.

Insert I$_3$ of FIG. 1 shows the apertures 315 of multi-aperture arrangement 305 arranged in a regular rectangular pattern 319 of equal pitch, resulting in primary electron beam spots 5 also arranged in a rectangular regular pattern 103 of equal pitch. Patterns 319 and 103 electron-optically correspond to each other in that sense that the primary electron beam path 13 supplies the primary electron beamlets 3 generated according to pattern 319 onto the substrate 7 by electron-optical components to form the pattern 103 on the object. The electron-optical components involved therein comprise the electron source arrangement 301, the collimating lens 303, the multi-aperture arrangement 305, the field lens 307, the beam splitter arrangement 400 and the objective arrangement 100. In practice, these electron-optical components introduce imaging errors such that the rectangular regular pattern will not be transformed into the exactly regular rectangular pattern 103.

Figure 12:
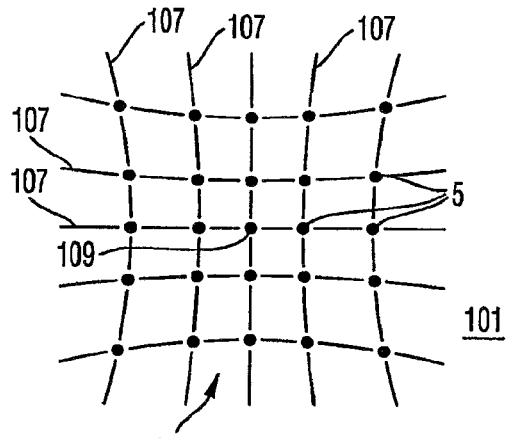
FIG. 12 shows a distorted pattern of primary electron beam spots.

FIG. 12 for illustration gives an example of an extremely distorted pattern 103 of primary electron beam spots that will be formed in practice from the regular rectangular pattern 319 according to the insert I$_3$ of FIG. 1. Beam spots 5 will not be arranged in a regular rectangular pattern, and grid lines 107 of pattern 103 will be curved lines such that a pitch between adjacent beam spots 5 increases with an increasing distance from a center 109 of pattern 103. Thus, pattern 103 has a "lower regularity" or progressively larger aperture displacement errors, the further each aperture is away from the array center as compared with pattern 319 of FIG. 1, I$_3$.

Figure 13:
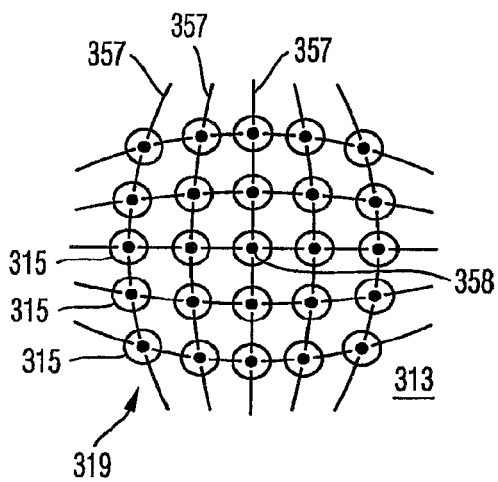
FIG. 13 shows an aperture arrangement for compensating a distortion as shown in FIG. 12.

FIG. 13 shows a variant of an array arrangement 319 of apertures 315 of multi-aperture plate 313 which may be used to correct a distortion of the pattern 103 of beam spots 5 shown in FIG. 12. The apertures 315 of multi-aperture plate 313 are positioned along grid lines 357 having a curvature opposite to the curvature of grid lines 107 of pattern 103 shown in FIG. 12. Apertures 315 are positioned at a pitch distance from adjacent apertures. In this example, the pitch distance decreases with increasing distance from a center 358 of pattern 319.

Pattern 319 is designed such that the primary electron beamlets generated thereby result in a rectangular regular pattern 103 of beam spots 5 formed on the object plane, as shown in FIG. 1, I$_1$.

In an embodiment of the electron microscopy system 1 shown in FIG. 1 it may be sufficient, however, to improve the regularity of beam spot pattern 103 only to such an extent that pattern 103 has a reduced distortion or improved regularity, respectively, while it is still not of a perfectly regular rectangular array. For instance, a regularity in only one direction of the pattern, such as the horizontal direction, or some other suitable direction may be improved. A regularity in such direction may be determined, for instance, by some mathematical method well known in the art, such as a Fourier analysis.

Figure 14:
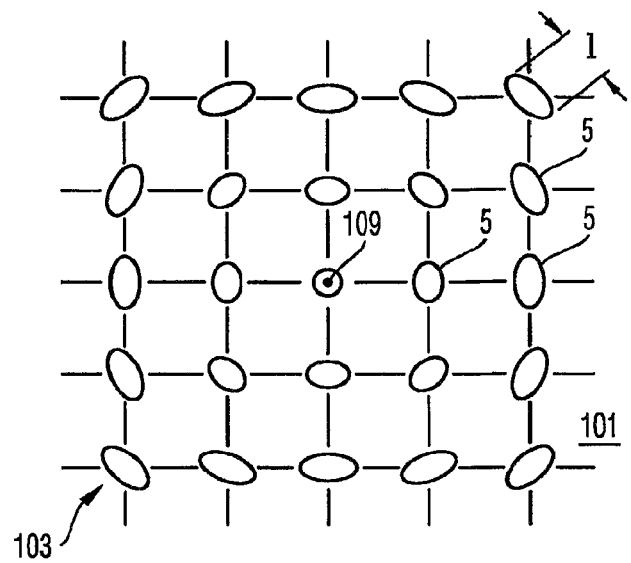
FIG. 14 shows a primary electron beam spot pattern distorted due to an astigmatism.

FIG. 14 shows a further example (also exaggerated for illustration) of a resulting pattern 103 of beam spots 5 formed on the object plane. In this example the electron-optical components involved in forming the pattern 103 introduce a field astigmatism such that the beamlets or beam spots are not formed as small circular spots for each primary electron beam spot 5 of the pattern 103. Moreover, beam spots 5 are of an elliptical or oval shape with a long axis thereof which increases with increasing distance from a center 109 of pattern 103.

A desired high resolution of the electron microscopy system 1 illustrated in FIG. 1 may not be achieved with distorted beam spots.

Figure 15:
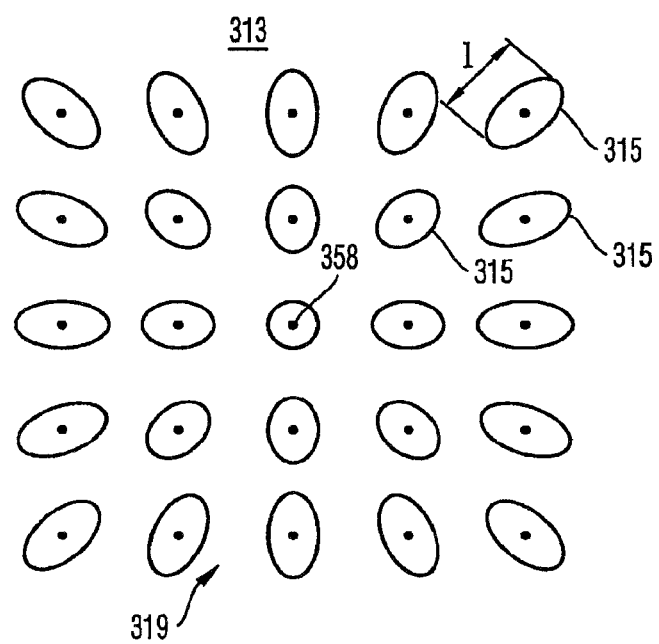
FIG. 15 shows a plane view on an aperture pattern for compensating an astigmatism distortion as shown in FIG. 14.

FIG. 15 shows a variant of a pattern 319 of apertures 315 of a multi-aperture plate 313 which may be used for compensating such effect of field astigmatism. Apertures 315 are of an elliptical shape having a long axis increasing with a distance from a center 358 of pattern 319 wherein an orientation of the long axis 1 with respect to center 358 is transverse to the orientation of long axis 1 of beam spots 5 as shown in FIG. 14. With such compensating elliptical or oval shapes it is possible to reduce an influence of a field astigmatism provided by the electron-optical components such that an ellipticity of beam spots 5 formed on object plane 101 will be reduced.

As illustrated in FIG. 1 it is one feature of the electron microscopy system 1 that spot plane 325 where foci 323 of the primary electron beamlets are generated by the multi-aperture arrangement 305 is imaged into an object plane 101 in which the surface of the object 7 to be inspected is positioned. Preferably, object plane 101 and the surface of the object 7 coincide.

In practice, the electron-optical components symbolically illustrated as M in FIG. 16, contribute to a field curvature of the electron-optical system such that flat plane 325 of foci 323 is imaged into a curved plane 101 close to the object surface 7. It is then not possible that the curved object plane 101 coincides with the flat surface of object 7, and the foci 323 are not perfectly imaged onto the surface of object 7, accordingly.

FIG. 17 shows one solution to such problem of field curvature of the optical components M involved in imaging the focus plane 325 onto object surface 7. Multi-aperture arrangement 305 is designed such that the plane 325 where the foci 323 of the primary electron beamlet 3 are generated is a curved plane. The curvature of focus plane is chosen such that the optical components M image plane 325 into a flat image plane 101 such that it is possible to position the object planar surface 7 to coincide with flat image plane 101.

FIG. 18 shows one variant of a multi-aperture plate 313 of the multi-aperture arrangement 305 for compensating a field curvature by generating foci 323 of beamlets 3 on a curved focus plane 325 as shown in FIG. 17. For such purpose a diameter "d" of the apertures 315 increases with increasing distance from a center 358 of aperture pattern 319. The increase in diameter of the apertures results in a reduced focusing power of a respective aperture and in an increased focal length of the lens function provided by the respective aperture 315. Thus, the focal length provided by central apertures of pattern 319 are smaller than focal lengths provided by apertures 315 at the periphery of pattern 319, resulting in a curvature of the plane 325 where the foci 323 are located as indicated in FIG. 17.

It is to be noted that in the example shown in FIGS. 17 and 18 the effect of the field curvature is compensated by diameters of the apertures increasing with the distance from the center 358 of pattern 319. However, depending on the optical properties of the optical components M involved in imaging focus plane 325 into object plane 101 it may be advantageous to have the aperture diameters "d" decreasing with increasing distance from center 358. It may also be advantageous that with increasing distance from the center 358 the diameters increase to a predetermined distance from the center and decrease thereafter. Further, it is not necessary that the diameters change symmetrically with respect to center 358 of pattern 319. It is also possible that diameters change from the left to the right of pattern 319 or from up to down or vice versa or any combinations thereof.

Further, changes in diameters of apertures 315 may be also used to account for variations in an electron density in the illuminating beam 311. For instance, if illuminating beam 311 is a non-homogeneous beam with a highest density in its center, the arrangement as shown in FIG. 18 will increase a beam strength of peripheral beamlets 3 with respect to central beams such that all primary electron beamlets 3 may have a substantially same beam strengths or beam current.

Figure 19:
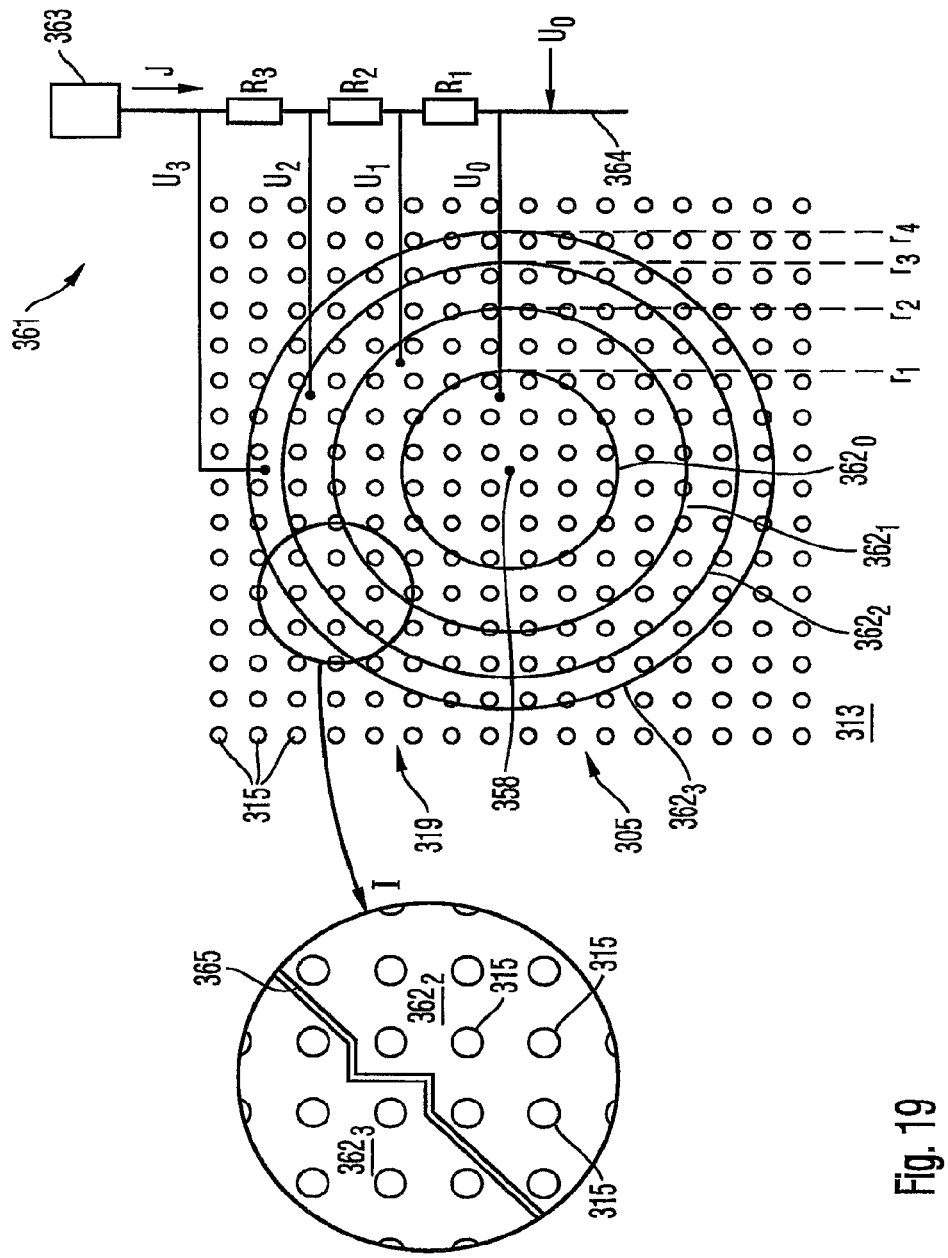
FIG. 19 illustrates a further multi-aperture arrangement for compensating a field curvature.

FIG. 19 is a further variant of a multi-aperture arrangement 305 which may be used for providing a curved focus plane 325 as indicated in FIG. 17. A multi-aperture plate 313 is divided into a central circular plate portion $362_0$ and a plurality of concentric ring-shaped or annular plate portions $362_1$, $362_2$, . . . . Adjacent plate portions 362 are electrically insulated from each other, and in each plate portion 362 a plurality of apertures 315 is formed. A voltage supply 361 is provided for supplying pre-defined voltages $U_0$, $U_1$, $U_2$, . . . to the respective plate portions $362_0$, $362_1$, $362_2$, . . . . According to an embodiment, the voltage supply 361 comprises a constant current source 363 and a plurality of resistors $R_1$, $R_2$, $R_3$ . . . and a fixed voltage point 364 such that voltages $U_0$, $U_1$, $U_2$ differ from each other. Constant current I and resistors $R_1$, $R_2$, . . . are chosen such that a focal length of the lens function provided by the respective apertures 315 increases with increasing distance from a center 358 of aperture pattern 319. According to an alternative embodiment, separate voltage sources may be provided for supplying voltages $U_0$, $U_1$, $U_2$, . . . to the plate portions $362_1$, $362_2$, . . . .

The ring-shaped plate portions $362_1$, $362_2$, . . . are electrically insulated from each other by an insulating gap 365 indicated in insert I of FIG. 19. The insulating gap 365 extends in a zigzag line between adjacent apertures 315.

It is to be noted that the above-mentioned features of shapes and designs of apertures of the multi-aperture plate may be combined with each other. For instance, an aperture may be of an elliptical shape as shown in FIG. 15 and may comprise additional shape features as shown in FIG. 8. Further, the array arrangement of the apertures may have aperture positions chosen such that a higher regularity spot pattern is formed on the wafer while the respective apertures in such array are of elliptical shape or have changing aperture diameters, as shown in FIG. 18, and have additional shape features as shown in FIG. 8. A multi-aperture plate having properties as illustrated above may be manufactured by a MEMS technology known to the person skilled in the art. Such technology may involve reactive ion etching. The multi-aperture plate according to one embodiment of the invention may be obtained, for example, from Team Nanotec GmbH, 78052 Villingen-Schwenningen, Germany.

FIGS. 20a to 20e show further variants of multi-aperture arrangement 305 for providing foci of electron beamlets 3 located on a curved focus plane 325.

Figure 20A:
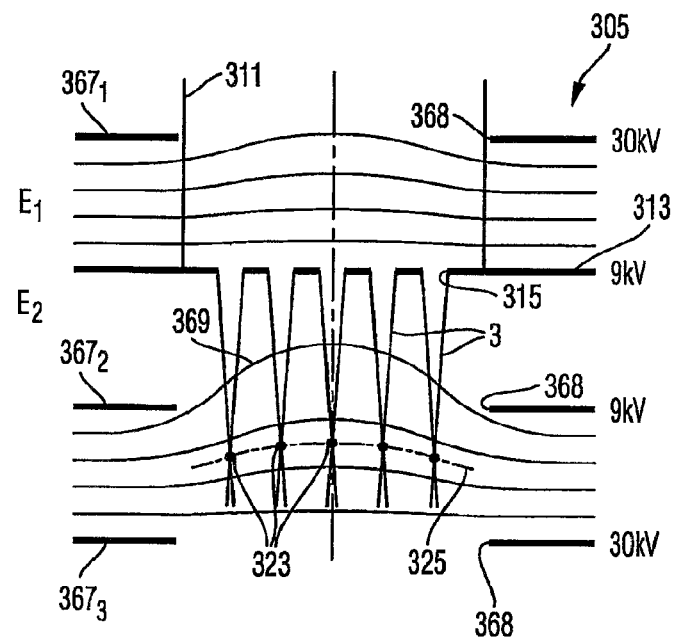
FIGS. 20*a*-20*e* illustrate further multi-aperture arrangements for compensating a field curvature.

The multi-aperture arrangement 305 shown in FIG. 20a comprises a multi-aperture plate 313 having a plurality of apertures 305 formed therein for generating electron beamlets 3 and focusing the same at foci 323 located at a focus plane 325 which is a curved plane. A focal length f of an aperture 305 may be calculated by $$f = -4\frac{U}{\Delta E},$$

wherein

U is the kinetic energy of the electrons of illuminating beam 311 when passing multi-aperture plate 313, and ΔE may be written as $E_1$-$E_2$ wherein $E_1$ is an electrical field strength immediately upstream of multi-aperture plate 313 at a location of the respective aperture, and $E_2$ is the electrical field strength immediately adjacent downstream of the aperture plate 313 at the same location.

Since the kinetic energy U is substantially constant over the cross section of illuminating beam 311 electrical fields $E_1$ and $E_2$ adjacent to the multi-aperture plate 313 may be shaped such that the focal length f provided by a respective aperture 315 depends from a position of the aperture across illuminating beam 311. Such shaping of the electrical fields $E_1$ and $E_2$ may be achieved by one or plural single-aperture plates 367 positioned at a distance upstream or downstream from multi-aperture plate 313. In FIG. 20a one single-aperture plate 367 is positioned at a distance upstream of multi-aperture plate 313 and an aperture 368 formed in single-aperture plate $367_1$ is chosen such that illuminating beam 311 penetrates aperture 368 to illuminate the apertures 315 formed in multi-aperture plate 313.

A further single-aperture plate $367_2$ is positioned at a distance downstream from multi-aperture plate 313, and a still further single-aperture plate $367_3$ is positioned at a distance downstream of single-aperture plate $367_2$. Apertures 368 formed in single-aperture plate $367_2$, $367_3$ are designed such that the beamlets 3 generated by multi-aperture plate 313 may pass the apertures 368.

A voltage supply (not shown in FIG. 20) is provided to supply a voltage of 30 kV in the illustrated example or some other suitable voltage to single-aperture plate $367_1$, a voltage of 9 kV in the illustrated example or some other suitable voltage to multi-aperture plate 313, a voltage of 9 kV to single-aperture plate $367_2$ and a voltage of 30 kV to single-aperture plate $367_3$. Field lines of electrical field $E_1$ generated by plates 313 and $367_1$ upstream of multi-aperture plate 313 are indicated in FIG. 20a as well as field lines of electrical field $E_2$ generated by plates 313, $367_2$, $367_3$ downstream of multi-aperture plate 313. $E_1$ is substantially constant across the cross section of illuminating beam 311 at positions close to multi-aperture plate 313. Electrical field $E_2$ has a stronger dependence on a lateral position on the multi-aperture plate 313 as indicated by a field line 369 having a curved shape and penetrating from a space between single-aperture plates $367_2$, $367_3$ into a space between multi-aperture plate 313 and single-aperture plate $367_2$. An aperture 305 positioned at a center of the aperture pattern will have a shorter focal length f than an aperture 305 positioned at a periphery of the aperture pattern, resulting in foci 323 of beamlet 3 located on a curved focus plane 325 as indicated broken lines in FIG. 20a.

Figure 20B:
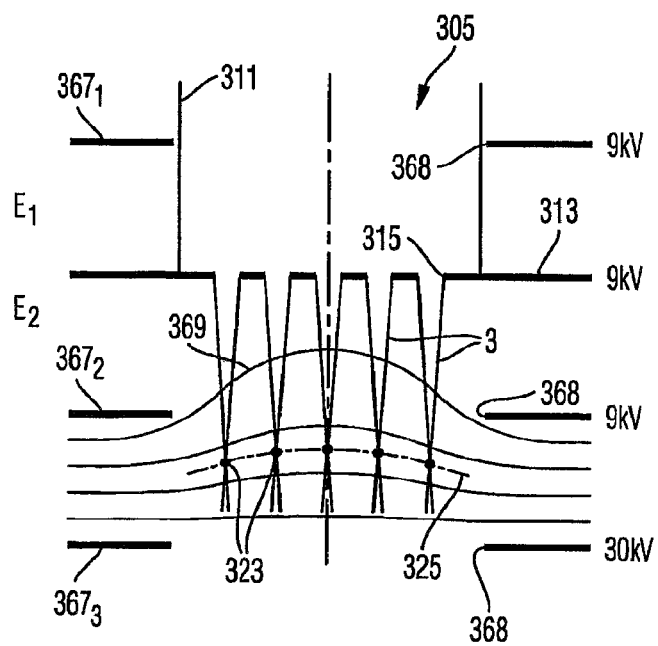

FIG. 20b shows a multi-aperture arrangement 305 of a same structure as that shown in FIG. 20a. Different therefrom, single-aperture plate $367_1$ is supplied with a same voltage of 9 kV as multi-aperture plate 313, such that electrical field $E_1$ upstream of multi-aperture plate 313 is substantially zero. Due to the non-homogeneous electrical field $E_2$ downstream of multi-aperture plate 313 the focal length of apertures 315 varies as shown in FIG. 20b such that the focus plane 325 is a curved plane.

Figure 20C:
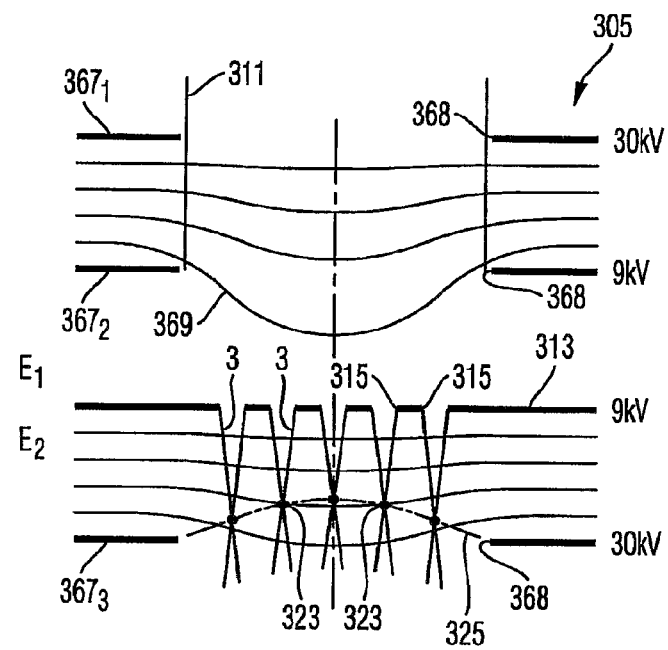

The multi-aperture arrangement 305 shown in FIG. 20c comprises one multi-aperture plate 313 and two single-aperture plates $367_1$ and $367_2$ positioned upstream of multi-aperture plate 313. One single-aperture plate $367_3$ is provided downstream multi-aperture plate 313.

Voltages of 30 kV are supplied to single-aperture plates $367_1$ and $367_3$, and voltages of 9 kV are supplied to single-aperture plate $367_2$ and multi-aperture plate 313. Upstream electric field $E_1$ is strongly inhomogeneous at locations close to multi-aperture plate 313 such that a focal length of the respective apertures 315 depends on their lateral position in the illuminating beam 311, resulting in a focus plane 325 suitably curved for correcting a field curvature as illustrated in FIG. 17.

Figure 20D:
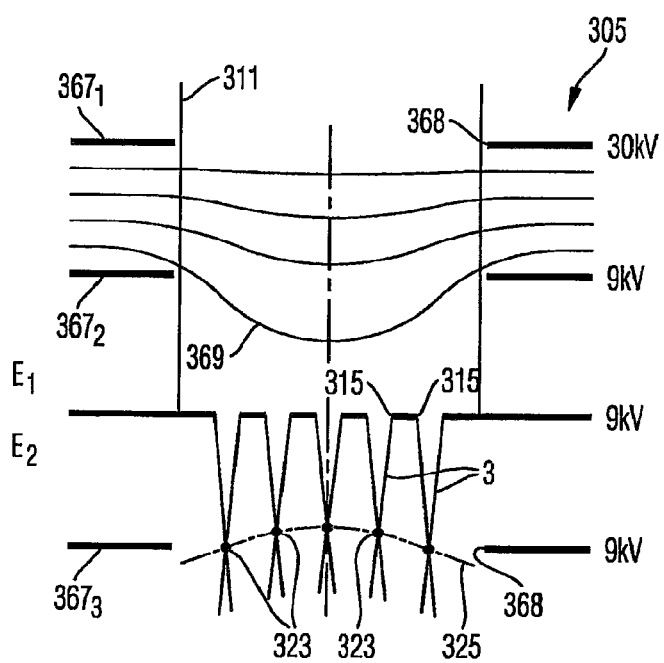

The multi-aperture arrangement 305 shown in FIG. 20d is of a similar structure than the arrangement shown in FIG. 20c. In contrast thereto a voltage of 9 kV is supplied to downstream single-aperture $367_3$ such that a substantially vanishing electrical field $E_2$ is generated downstream of multi-aperture plate 313. Still, the inhomogeneous electrical field $E_1$ provided upstream of multi-aperture plate 313 results in the desired variation of the focal lengths of respective apertures across the illuminating beam cross section.

In FIGS. 20a to 20d the multi-aperture plate 313 is at a lower potential (9 kV) as compared to the outer single-aperture plates $367_1$, $367_3$, respectively (30 kV). This results in a focusing effect of the apertures 315 such that real foci 323 are generated downstream of the multi-aperture plate 313.

Figure 20E:
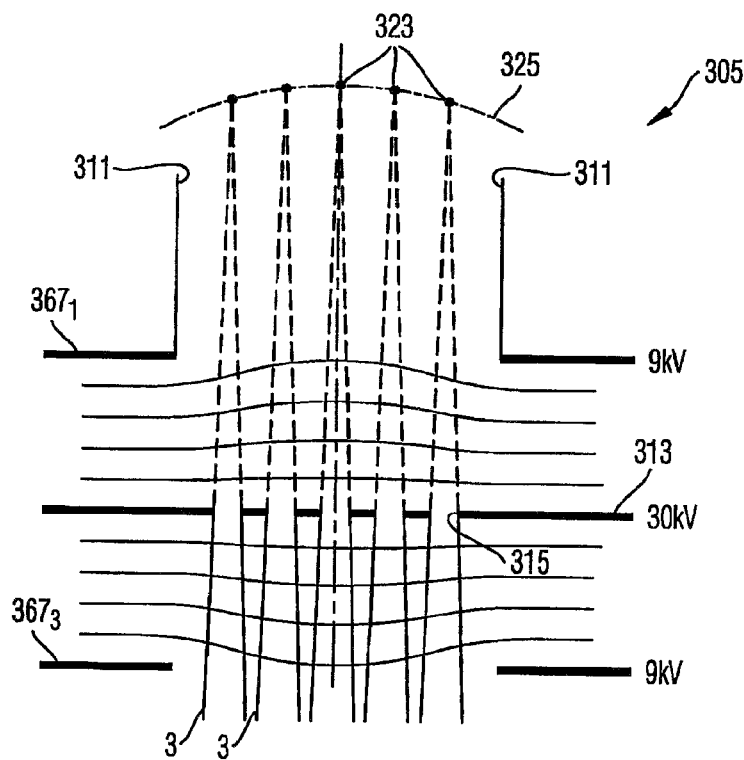

In contrast thereto a multi-aperture arrangement 305 shown in FIG. 20e has a multi-aperture plate 313 supplied with 30 kV and a single-aperture plate $367_1$ upstream and a single-aperture plate $367_3$ downstream of multi-aperture plate 313 are supplied with a lower potential of 9 kV. This results in a defocusing effect of apertures 315 formed in multi-aperture plate 313 such that virtual foci 323 located on a curved focus plane 325 upstream of the multi-aperture plate within the beam path of illuminating beam 311 are generated. Even though the foci 323 shown in FIG. 20e are virtual foci, it is still possible to image these virtual foci 323 onto the object to be inspected, wherein the curvature of focus plane 325 is designed such that a field curvature is compensated for, as illustrated in FIG. 17.

In the above variants shown in FIG. 20 the voltages of 9 kV and 30 kV are merely exemplary voltages, and it is possible to supply the plates 313 and 367 with voltages different therefrom. For instance, the single-aperture plates $367_2$ may be supplied with voltages which are even slightly lower than the voltage which is supplied to multi-aperture plate 313 and which are lower than the high voltages supplied to plates $367_1$, $367_3$ in FIG. 20a and FIG. 20c and supplied to plate $367_3$ in FIGS. 20a, 20b and 20c.

Figure 21:
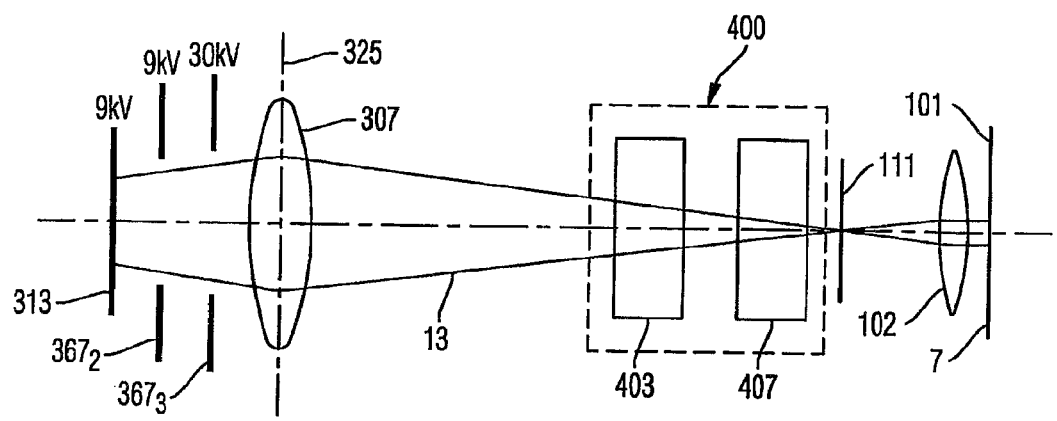
FIG. 21 is a schematic illustration of a primary electron beam path.

FIG. 21 is a schematic illustration of the primary electron beam path 13 between focus plane 325 and object plane 101 in which object surface 7 is positioned, wherein the beam path in the beam splitter is shown unfolded for ease of representation. Downstream of field lens 307 coinciding with focus plane 325 primary electron beam path 13 is a converging beam path having a cross-over in an intermediate plane 111 upstream of objective lens 102 and downstream of beam splitter/combiner arrangement 400 wherein the beam path passes an upstream magnetic field portion 403 and a downstream magnetic field portion 407 as illustrated below.

Figure 22:
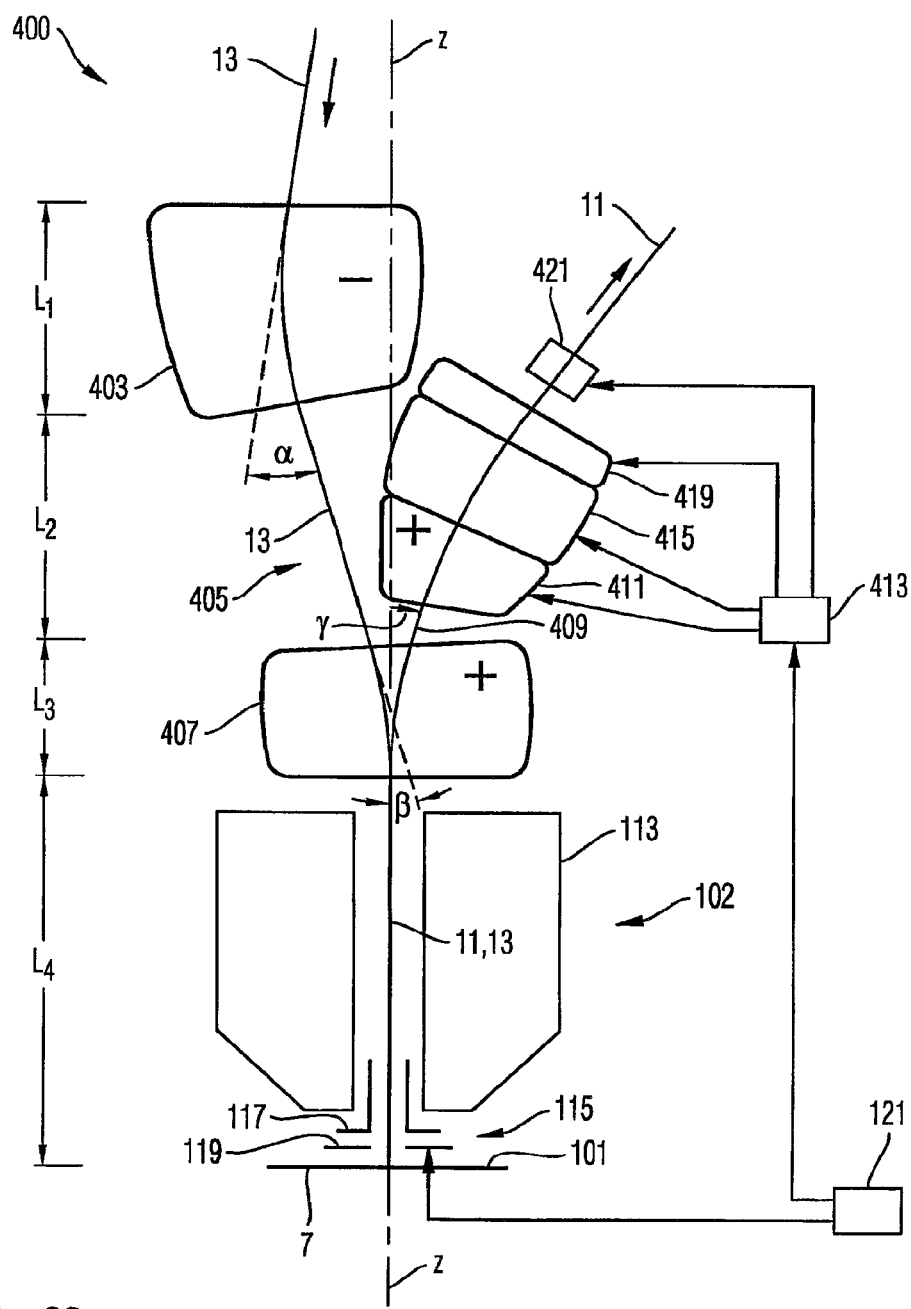
FIG. 22 schematically illustrates a beam splitter/combiner arrangement in cooperation with an objective arrangement which may be used in the electron microscopy system as shown in FIG. 1.

FIG. 22 is a schematic illustration of beam splitter arrangement 400 and objective lens 102. The primary electron beam path 13 comprising the plurality of primary electron beamlets enters a first magnetic field portion 403 of beam splitter/combiner arrangement 400. In field portion 403 there is provided a homogeneous magnetic field deflecting the primary electron beam path by an angle α to the left. Thereafter the primary electron beam path 13 passes a drift region 405 which is substantially free of magnetic fields such that the primary electron beam path 13 follows a straight line in drift region 405. Thereafter the primary electron beam path 13 enters a field region 407 in which a homogeneous magnetic field is provided for deflecting the primary electron beam path 13 by an angle β to the right. Thereafter, primary electron beam path 13 enters the objective lens 102 for focusing the primary electron beamlets onto the surface of object 7 positioned in object plane 101.

The objective lens arrangement 100 comprises a magnetic lens group having a magnetic focusing function and an electrostatic lens group 115 having an electrostatic focusing function on the primary electron beamlets. Further, the electrostatic lens group 115 comprising an upper electrode 117 and a lower electrode 119 performs a decelerating function on the primary electrons by an electrical field generated between electrodes 117 and 119 for decelerating the primary electrons before impinging on object surface 7.

A controller 121 is provided for changing the voltage supplied to lower electrode 119 such that the kinetic energy with which the primary electrons impinge onto the object, the landing energy, may be adjusted in a range of about 0.3 keV to 2.0 keV. The kinetic energy with which the primary electrons pass the beam splitter/combiner arrangement 400 is constant and independent of the landing energy of the primary electrons on the object surface and of a value of 30 keV in the present example.

Field portion 403 extends over a length $L_1$, drift region extends over a length $L_2$, second field portion 407 extends over a length $L_3$ and a distance between a lower edge of second field portion 407 and object plane 101 is $L_4$ in the present example. $L_1$ is about 75 mm, $L_2$ is about 90 mm, $L_3$ is about 60 mm and $L_4$ is about 80 mm.

A person skilled in the art will be familiar with the technology for designing and constructing the beam splitter comprising plural magnetic field regions as illustrated above. Reference may be made to U.S. Pat. No. 6,040,576 or "SMART: A Planned Ultrahigh-Resolution Spectromicroscope For BESSY II" by R. Fink et al, Journal of Electron Spectroscopy and Related Phenomena 84, 1987, pages 231 to 250 or "A Beam Separator With Small Aberrations" by H. Müller et al, Journal of Electron Microscopy 48(3), 1999, pages 191 to 204.

The absolute values of the field strength in field portions 403 and 407 are about equal, and length $L_1$ and $L_3$ of field portions 403 and 407 are chosen such that a spatial dispersion induced by the deflection by the angle α to the left and the subsequent deflection by the angle β to the right is substantially zero. Further, the field portions 403 and 407 and the drift region 405 are chosen such that the deflections induced by the beam splitter/combiner arrangement 400 on the primary electron beam path 13 are in first order substantially stigmatic and in first order substantially distortion free. Thus, the pattern 327 of the foci 323 generated by multi-aperture arrangement 305 may be imaged onto the object plane 101 with a high quality. This imaging quality is maintained substantially independent of the landing energy of the primary electrons onto the object 7.

The secondary electron beam path 11 comprising the plurality of secondary electron beamlets 9 is separated from the primary electron beam path 13 by field region 407 which deflects the secondary electron beam path 11 by an angle γ to the right.

The secondary electrons emanating from the object 7 with a kinetic energy range of about 0 eV to 100 eV will be accelerated by the electrical field generated by upper and lower electrodes 117, 119 to a kinetic energy which is dependent on a setting provided by controller 121 for adjusting the landing energy of the primary electrons. Thus, the kinetic energy of the secondary electrons entering field region 407 will change in dependence of the landing energy of the primary electrons.

Instead of using the upper and lower electrodes 117, 119 for generating the electrical field, it is also possible to omit lower electrode 119 and to use object 7 as lower electrode for generating a major portion of the electrical field. A corresponding voltage is then applied to the object.

Deflection angle γ for the secondary electron beam path 11 provided by field region 407 will change, accordingly. After leaving field region 407, the secondary electron beam path passes a drift region 409 which is substantially free of magnetic fields before entering a further magnetic field region 411 providing a homogeneous magnetic field deflecting the secondary electron beam path 11 further to the right. A field strength of field region 411 may be adjusted by a controller 413. When leaving the field region 411 the secondary electron beam path 11 immediately enters a further field region 415 providing a homogeneous magnetic field, a field strength of which may be also adjusted by controller 413. Controller 413 operates in dependence of a setting of the landing energy of primary electron beams and adjusts the magnetic field strength in field regions 411 and 415 such that the primary electron beam path leaves field region 415 at a pre-defined position and in a pre-defined direction which are independent of the landing energy of the primary electrons and the deflection angle γ, respectively. Thus, the two field regions 411, 415 perform a function of two subsequent beam deflectors which make it possible to adjust the secondary electron beam to coincide with the pre-defined secondary electron beam path 11 when the same leaves magnetic field region 415.

The changes in the magnetic field strengths of field regions 411, 415 caused by controller 413 result in changes of a quadrupole effect which these electron optical elements 411, 415 have on the secondary electrons. To compensate for such changes of a quadrupole effect a further magnetic field region 419 is provided immediately downstream of field region 415. In magnetic field region 419 a homogeneous magnetic field is provided, a field strength of which is controlled by controller 413. Further, downstream of magnetic field region 419 a quadrupole lens 421 is provided which is controlled by controller 413 to compensate in cooperation with magnetic field region 419 the remaining quadrupole effect induced by field portions 411, 415 when compensating the beam path for different landing energies of the primary electrons.

The electron-optical components 407, 409, 411, 415, 419 and 421 provided in the secondary electron beam path are configured such that, for one particular setting of the landing energy of the primary electrons, the secondary electron beam path 11 through the beam splitter/combiner arrangement 400 is in first order substantially stigmatic, in first order distortion free, and in first order dispersion corrected. For other settings of the landing energy than 2 kV this imaging quality may be maintained, a reduction of the dispersion correction to a limited amount occurs, however.

It is to be noted that an intermediate image of object plane 101 is formed in a region of field portions 407, 411, 415 and 419. A position of the intermediate image will change along the beam axis in dependence of the setting of the landing energy of the primary electrons and the kinetic energy of the secondary electrons, accordingly.

It is to be noted that apart from magnetic field regions 403 and 407 no further beam deflecting magnetic field regions are provided in the primary electron beam path 13 of the electron microscopy system 1. The term "further beam deflecting magnetic field regions" shall comprise magnetic field regions which are provided for providing a substantial deflection angle to the primary electron beam and shall not comprise such field regions which are merely present for some other purposes, such as providing a possibility of a fine-adjustment of the primary electron beam path. Thus, a beam deflecting magnetic field region providing a substantial angle of deflection will be a field region providing a deflection angle higher than 5° or higher than 10°. As already mentioned such further beam deflecting magnetic field regions are not present in the primary electron beam path, and still the beam splitter 400 is configured such that it provides sufficiently well determined optical properties for the plurality of primary electron beamlets passing therethrough such that the high quality primary electron beam spot pattern 103 is formed in the object plane. In particular, the primary electron beam path is to first order stigmatic and free of distortion.

An electron lithography apparatus will be illustrated with reference to FIG. 23.

Figure 23:
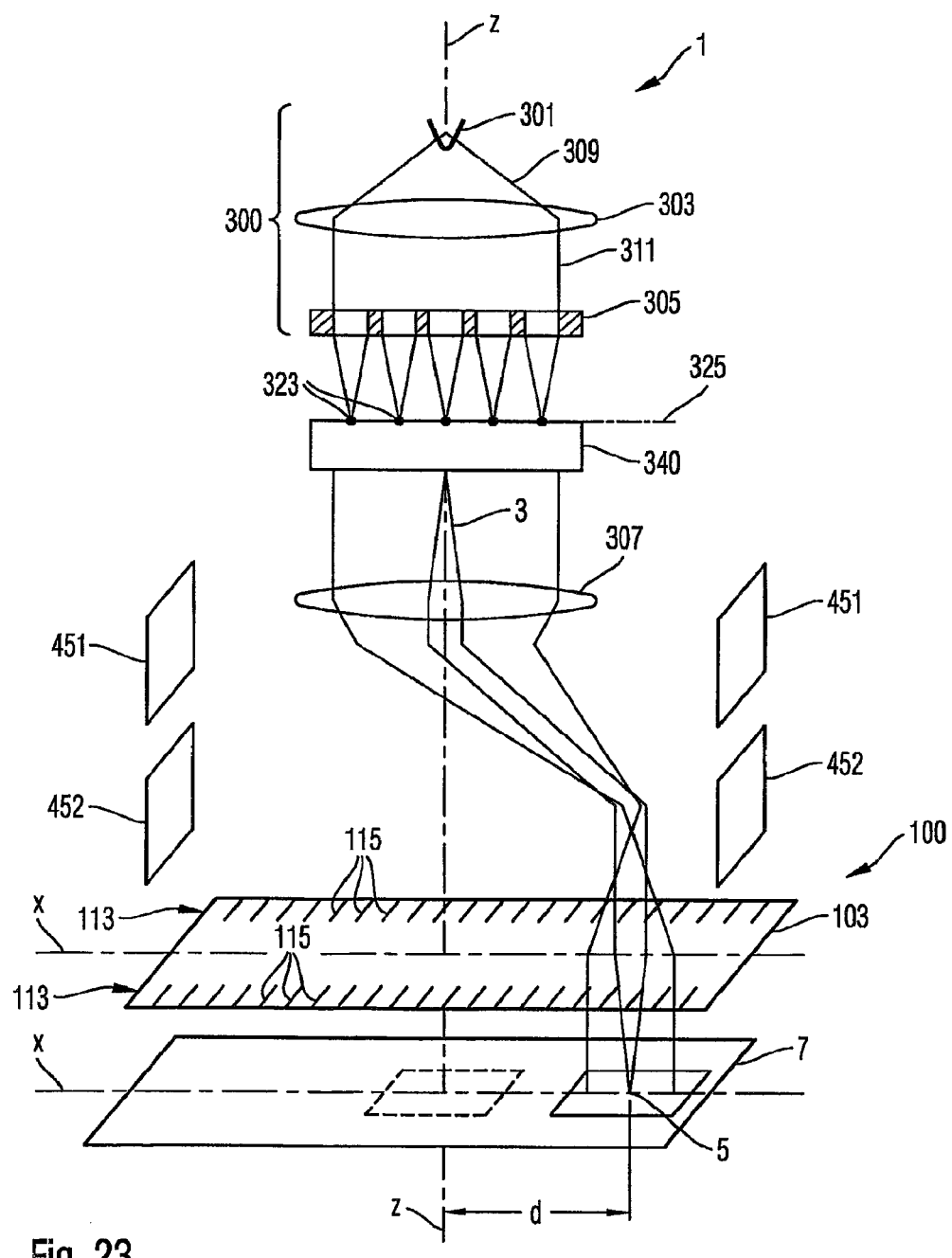
FIG. 23 is an illustration of an electron lithography system according to an embodiment of the invention.

The electron lithography system shown in FIG. 23 comprises a beamlet generating arrangement 300 and an objective arrangement 100. The beamlet generating arrangement 300 generates a plurality of writing electron beamlets 3 which are directed to an object 7 by the objective arrangement 100. The object, such as a semiconductor wafer, is coated with a charged-particle-sensitive resist which is exposed by the writing electron beamlets 3. After developing the resist, and subsequent etching structures may be formed in the substrate in dependence on the exposure by the writing beamlets 3.

The writing beamlets are generated in the beamlet generating arrangement 300 similar to the generation of primary electron beamlets as illustrated with respect to the electron microscopy system above: An electron source arrangement 301 generates a diverging electron beam 309 which is collimated by a collimating lens 303 to form a beam 311 for illuminating a multi-aperture arrangement 305. Downstream of the multi-aperture arrangement 305 an array of foci 323 of the writing electron beamlets is formed.

In a plane 325 where the foci 323 are formed there is provided a beam blanking arrangement 340 for switching the plurality of writing beams selectively on and off. The beam blanking arrangement 340 comprises a further multi-aperture plate (not shown in FIG. 23) arranged such that a respective focus 323 is formed in each aperture thereof. Each aperture provides the function of a beam deflector which may be formed by two electrodes on opposite sides of the aperture. The electrodes are supplied by voltages controlled by a computer. When no voltage is applied to the electrodes of the aperture, the beamlet passing therethrough will pass along a straight line, i.e. the beamlet will not be deflected. When a suitable voltage is supplied to the electrodes an electrical field will be generated within the aperture to deflect the respective beamlet by a suitable angle.

According to an embodiment the beam blanking arrangement 340 is of a type illustrated in "A Multi-Blanker For Parallel Electron Beam Lithography" by G. I. Winograd, Ph.D. Thesis, Stanford University, 2001, which document is incorporated herein by reference.

Downstream of plane 325 where the foci 323 are formed there is provided a further multi-aperture plate (not shown in FIG. 23) having a plurality of apertures positioned such that each writing electron beamlet will pass through the aperture when it is not deflected by the deflecting arrangement, and such that it will substantially not pass through the aperture when the beam is deflected.

Thus, downstream of this further aperture plate the writing electron beamlets are selectively switched on and off, depending on whether the respective deflector is supplied with a voltage or not. In a situation shown in FIG. 23 only one writing beam passes the beam blanking unit, i.e. only one beam is switched on.

Downstream of the beam blanking unit there are provided subsequent beam deflectors 451, 452 for displacing the writing beamlets by a distance d with respect to their beam path before traversing the beam deflectors 451, 452.

The objective arrangement 100 includes an objective lens 102 of a type referred to as a "comb lens" as it is disclosed in US 2003/0066961 A1.

The objective lens 102 comprises two rows 113 of field source members extending in a direction transversely to the primary electron beam path. The field source members 115 which may be excited such that a desired electrical field configuration is provided at a desired position in a space between the two rows of field source members. Thus, an accurate beam-manipulating field configured to focus the plurality of primary electron beamlets onto the object may be provided in that region where the displaced writing beamlets 3 are incident on the objective lens arrangement 100. By using the comb lens as the objective lens 102 it is possible to displace the focusing lens function together with a scan deflection provided by the beam deflectors 451, 452, and finely focused writing electron beam spots will be formed on the substrate surface.

By switching the respective writing electron beamlets on and off and scanning the writing electron beam spots 5 across the substrate surface it is possible to expose the resist provided on the object according to a predefined exposure pattern stored in the controlling computer.

Thus, it will be seen that the disclosure of the present application in particular includes the following items (1) to (106):

(1) A particle-optical arrangement comprising:
at least one charged-particle source for generating at least one beam of charged particles;
at least one multi-aperture plate arranged in a beam path of the at least one beam of charged particles, wherein the at least one multi-aperture plate has a plurality of apertures formed therein in a predetermined first array pattern, wherein a plurality of charged-particle beamlets is formed from the at least one beam of charged particles downstream of the multi-aperture plate, and wherein a plurality of beam spots is formed in an image plane of the particle-optical apparatus by the plurality of charged-particle beamlets, the plurality of beam spots being arranged in a second array pattern; and
at least one particle-optical element for manipulating the at least one beam of charged particles and/or the plurality of charged-particle beamlets;
wherein the first array pattern has at least one first pattern regularity in a first direction, and the second array pattern has at least one second pattern regularity in a second direction electron-optically corresponding to the first direction, and wherein the second regularity is higher than the first regularity.

(2) The particle-optical arrangement according to Item (1), wherein the first pattern regularity of the first array pattern is reduced with respect to the second pattern regularity of the second array pattern for compensating a distortion of the at least one particle-optical element.

(3) The particle-optical arrangement according to Item (2), wherein the at least one particle-optical element comprises an objective lens for focusing the beamlets onto an object positionable in the image plane.

(4) The particle-optical arrangement according to one of Item (1) to (3), wherein a distance between apertures adjacent to each other in the first direction of the multi-aperture plate continuously decreases in dependence of a distance from a center of the first array pattern.

(5) The particle-optical arrangement according to one of Items (1) to (4), wherein the second array pattern has the second pattern regularity higher than the first pattern regularity only in one single first direction.

(6) The particle-optical arrangement according to Item (5), wherein the second pattern is a substantially constant pitch pattern in the one single first direction.

(7) The particle-optical arrangement according to one of Items (1) to (6), wherein the second array pattern has the second pattern regularity higher than the first pattern regularity in two first directions oriented transversely to each other.

(8) A particle-optical arrangement, in particular in combination with the particle-optical arrangement according to one of Items (1) to (7), the arrangement comprising:
at least one charged-particle source for generating at least on beam of charged particles;
at least one multi-aperture plate arranged in a beam path of the at least one beam of charged particles, wherein the at least one multi-aperture plate has a plurality of apertures formed therein in a predetermined first array pattern, wherein a plurality of charged-particle beamlets is formed from the at least one beam of charged particles downstream of the multi-aperture plate, and wherein a plurality of beam spots is formed in an image plane of the particle-optical arrangement by the plurality of charged-particle beamlets; and
at least one particle-optical element for manipulating the at least one beam of charged particles and/or the plurality of charged-particle beamlets;
wherein a diameter of the apertures in the multi-aperture plate varies with an increasing distance from a center of the first pattern.

(9) The particle-optical arrangement according to Item (8), wherein the diameter of the apertures in the aperture plate increases or decreases with the increasing distance from the center of the first pattern for compensating a field curvature of the at least one particle-optical element.

(10) The particle-optical arrangement according to Item (8) or (9), wherein the diameter of the apertures in the aperture plate increases with the increasing distance from the center of the first pattern for compensating an inhomogeneous current thereof of the at least one beam of charged particles across a cross section.

(11) The particle-optical arrangement according to one of Item (8) or (10), wherein the diameter of the apertures in the aperture plate increases with the increasing distance from the center of the first pattern.

(12) A particle-optical arrangement, in particular in combination with the particle-optical arrangement according to one of Items (1) to (11), the arrangement comprising:
at least one charged-particle source for generating at least one beam of charged particles;
at least one multi-aperture plate arranged in a beam path of the at least one beam of charged particles, wherein the at least one multi-aperture plate has a plurality of apertures formed therein in a predetermined first array pattern, wherein a plurality of charged-particle beamlets is formed from the at least one beam of charged particles downstream of the multi-aperture plate, and wherein a plurality of beam spots is formed in an image plane of the particle-optical arrangement by the plurality of charged-particle beamlets; and
at least one particle-optical element for manipulating the at least one beam of charged particles and/or the plurality of charged-particle beamlets;
wherein a shape of at least one group of the apertures is an elliptical shape.

(13) The particle-optical arrangement according to Item (12), wherein the shape of the at least one group of the apertures is of the elliptical shape for compensating an astigmatism of the at least one focusing lens.

(14) The particle-optical arrangement according to Item (11) or (13), wherein an ellipticity of the elliptical shape of the apertures increases in dependence of a distance of the aperture from a center of the first pattern.

(15) The particle-optical arrangement according to one of Items (12) to (14), wherein a long axis of the elliptical shapes of the apertures is radially oriented with respect to a center of the first pattern.

(16) The particle-optical arrangement according to one of Items (12) to (15), wherein a long axis of the elliptical shapes of the apertures is oriented under an angle with respect to a radial direction with respect to a center of the first pattern.

(17) The particle-optical arrangement according to Item (16), wherein the angle increases in dependence of a distance of the respective aperture from the center of the first pattern.

(18) The particle-optical arrangement according to one of Items (1) to (17), further comprising at least one voltage source for supplying at least one voltage to the at least one multi-aperture plate.

(19) A particle-optical component comprising:
at least one multi-aperture plate having a plurality of apertures formed therein, each for manipulating particles of a charged particle beamlet passing therethrough;
wherein the multi-aperture plate comprises plural conductive layer portions arranged substantially in a single plane, wherein plural apertures are formed in each of the plural conductive layer portions, and wherein a resistant gap, in particular a non-conductive gap, is formed between adjacent conductive layer portions.

(20) The particle-optical component according to Item (19), wherein the component is configured such that adjacent conductive layer portions are at different electric potentials.

(21) The particle-optical component according to one of Items (19) to (20), further comprising at least one voltage source for supplying predetermined voltages to the plural conductive layer portions.

(22) The particle-optical component according to one of Items (19) to (21), further comprising at least one resistor electrically coupling different conductive layer portions.

(23) The particle-optical component according to Item (22), wherein a resistance of a first resistor connecting a first pair of adjacent conductive layer portions located at a first distance from a center of a first pattern of the plurality of apertures formed in the at least one multi-aperture plate is higher than a resistance of a second resistor connecting a second pair of adjacent conductive layer portions located at a second distance smaller than the first distance from the center of the first pattern.

(24) The particle-optical component according to one of Items (19) to (23), wherein the plurality of conductive layer portions comprises a first conductive layer portion substantially surrounding a second conductive layer portion.

(25) The particle-optical component according to one of Items (19) to (24), wherein the plurality of conductive layer portions comprises a plurality of ring-shaped portions symmetrically arranged with respect to a center of the first pattern.

(26) The particle-optical component according to Item (25), wherein a radial width of the ring-shaped conductive layer portions decreases with an increasing distance from the center of the first pattern.

(27) A particle-optical arrangement, in particular in combination with the particle-optical arrangement according to one of Items (1) to (18), the arrangement comprising:

at least one charged-particle source for generating at least one beam of charged particles, or a plurality of charged particle beamlets; and at least one particle-optical component according to one of Items (19) to (26).

(28) The particle-optical arrangement according to Item (27), wherein a plurality of charged-particle beamlets is formed from the at least one beam of charged particles downstream of the multi-aperture plate, and wherein a plurality of beam spots is formed in an object plane of the particle-optical arrangement by the plurality of charged-particle beamlets;

the arrangement further comprising at least one focusing lens arranged in a beam path of the at least one beam of charged particles upstream of the multi-aperture plate and/or in a beam path of the plurality of charged-particle beamlets downstream of the multi-aperture plate;

wherein the arrangement is configured such that adjacent conductive layer portions are at different electric potentials for compensating a field curvature of the at least one focusing lens.

(29) The particle-optical arrangement according to one of Items (27) to (28), wherein a focusing effect performed by the apertures on a respective beamlet decreases with increasing distance from a center of the first pattern.

(30) A particle-optical component, in particular according to one of Items (19) to (26), the component comprising:

a first multi-aperture plate made of an insulating substrate having a plurality of apertures formed therethrough, wherein at least an interior of the apertures formed in the insulating substrate is covered with a conductive layer.

(31) The particle-optical component according to Item (30), wherein the conductive layer is further formed on at least one main flat surface of the first multi-aperture plate.

(32) The particle-optical component according to Item (30) or (31), wherein at least one second multi-aperture plate is provided on a main flat surface of the first multi-aperture plate, wherein the apertures formed in the first multi-aperture plates and apertures formed in the second multi-aperture plates form common throughholes through the structure of the first and second multi-aperture plates.

(33) The particle-optical component according to Item (32), wherein a conductivity of the conductive layer is lower than a conductivity of the second multi-aperture plate.

(34) The particle-optical component according to one of Items (30) to (33), wherein an electrical resistance between both main flat surfaces of the first multi-aperture plate is in a range of about 250Ω to 8 MΩ, a range of about 250Ω to 4 MΩ, a range of about 4 MΩ to 8 MΩ, a range of about 250Ω to 800Ω, a range of about 800Ω to 1.5 MΩ, a range of about 1.5 MΩ to 3 MΩ, a range of about 3 MΩ to 5 MΩ, and/or a range of about 5 MΩ to 8 MΩ.

(35) A particle-optical component, in particular according to one of Items (19) to (34), the component comprising:

a first multi-aperture plate having first and second main flat surfaces and a plurality of apertures formed therethrough, wherein the multi-aperture plate is made of a material having a conductivity such that an electrical resistance between both main flat surfaces of the first multi-aperture plate is in a range of about 250Ω to 8 MΩ, a range of about 250Ω to 4 MΩ, a range of about 4 MΩ to 8 MΩ, a range of about 250Ω to 800Ω, a range of about 800Ω to 1.5 MΩ, a range of about 1.5 MΩ to 3 MΩ, a range of about 3 MΩ to 5 MΩ, and/or a range of about 5 MΩ to 8 MΩ.

(36) A particle-optical arrangement, in particular in combination with the particle-optical arrangement according to one of Items (1) to (29), the arrangement comprising:

at least one charged-particle source for generating at least on beam of charged particles, or a plurality of charged particle beamlets; and at least one particle-optical component according to one of Items (30) to (35).

(37) A particle-optical component, in particular in combination with the particle-optical component according to one of Items (19) to (35), the component comprising:

at least one multi-aperture plate having a plurality of beam-manipulating apertures formed therein, each for manipulating a charged-particle beamlet passing therethrough, wherein the plurality of beam-manipulating apertures is arranged in a predetermined first array pattern; and wherein at least one of the beam-manipulating apertures has associated therewith plural field-correcting apertures formed in the multi-aperture plate.

(38) The particle-optical component according to Item (37), wherein each of the field-correcting apertures associated with a respective beam-manipulating aperture has a size smaller than a size of the respective beam-manipulating aperture.

(39) The particle-optical component according to Item (37) or (38), wherein the field correcting apertures are formed as through-holes extending through the multi-aperture plate.

(40) The particle-optical component according to Item (37) or (38) wherein the field correcting apertures are formed as blind-holes having a bottom formed in the multi-aperture plate.

(41) The particle-optical component according to one of Items (37) to (40), wherein the particular one of the at least one beam-manipulating aperture having the plural field-correcting apertures associated therewith has a number of closest neighboring beam-manipulating apertures spaced apart in a circumferential direction thereabout, wherein at least one of the field-correcting apertures is positioned, when seen in the circumferential direction, in between two adjacent closest neighboring beam-manipulating apertures which are located adjacent to each other in the circumferential direction.

(42) A particle-optical arrangement, in particular in combination with the particle-optical arrangement according to one of Items (1) to (36), the arrangement comprising:

at least one charged-particle source for generating at least one beam of charged particles; and at least one particle-optical component according to one of Items (35) to (37).

(43) The particle-optical arrangement according to Item (42), further comprising a multi-aperture stop for forming the plurality of charged-particle beamlets from the beam of charged particles such that the field-correcting apertures are not exposed to charged particles, wherein the multi-aperture stop is positioned upstream of the particle-optical component.

(44) The particle-optical arrangement according to Item (42), further comprising a multi-aperture stop for intercepting charged particles having passed the field-correcting apertures, wherein the multi-aperture stop is positioned downstream of the particle-optical component.

(45) A particle-optical component, in particular in combination with the particle-optical component according to one of Items (19) to (41), the component comprising:

at least one multi-aperture plate having a plurality of beam-manipulating apertures formed therein, each for manipulating particles of a charged-particle beamlet passing therethrough, wherein the plurality of beam-manipulating apertures is arranged in a predetermined first array pattern; and wherein at least one of the beam-manipulating apertures has a number N of closest neighboring beam-manipulating apertures spaced apart in a circumferential direction thereabout, and wherein a symmetry of a shape of the at least one beam-manipulating aperture comprises a N-fold symmetry.

(46) A particle-optical component, in particular in combination with the particle-optical component according to one of Items (19) to (41), the component comprising:

at least one multi-aperture plate having a plurality of beam-manipulating apertures formed therein, each for manipulating particles of a charged-particle beamlet passing therethrough, wherein the plurality of beam-manipulating apertures is arranged in a predetermined first array pattern; and wherein at least one of the beam-manipulating apertures has a shape having at least one symmetry component corresponding to a symmetry of the first array pattern around the at least one beam-manipulating aperture.

(47) The particle-optical component according to Item (45) or (46), wherein the first array pattern is a substantially rectangular array pattern and wherein the symmetry comprises a fourfold symmetry.

(48) The particle-optical component according to Item (45) or (46), wherein the first array pattern is a substantially hexagonal array pattern and wherein the symmetry comprises a sixfold symmetry.

(49) A particle-optical arrangement, in particular in combination with the particle-optical arrangement according to one of Items (1) to (40), the arrangement comprising:

at least one charged-particle source for generating at least on beam of charged particles, or a plurality of charged-particle beamlets; and at least one particle-optical component according to one of Items (45) to (48).

(50) A particle-optical arrangement, in particular in combination with the particle-optical arrangement according to one of Items (1) to (49), the arrangement comprising:

at least one charged-particle source for generating at least on beam of charged particles, or a plurality of charged-particle beamlets; and at least one multi-aperture plate arranged in a beam path of the at least one beam of charged particles and the plurality of charged-particle beamlets, respectively, wherein the at least one multi-aperture plate has a plurality of apertures formed therein in a predetermined first array pattern, and wherein a plurality of beam spots is formed in an object plane of the particle-optical arrangement downstream of the multi-aperture plate, the plurality of beam spots being arranged in a second array pattern;

wherein a number of the beam spots is less than a number of the apertures formed in the multi-aperture plate.

(51) The particle-optical arrangement according to Item (50), wherein apertures not contributing to forming the beam spots are formed as blind-holes in the multi-aperture plate.

(52) The particle-optical arrangement according to Item (50) or (51), wherein beamlets forming the beam spots pass the apertures of a central region of the first array pattern, and wherein the apertures of a peripheral region of the first array pattern do not contribute to forming the beam spots.

(53) The particle-optical arrangement according to one of Items (50) to (52), further comprising a multi-aperture stop for forming the plurality of charged-particle beamlets from the beam of charged particles such that the apertures of the peripheral region are not exposed to charged particles, wherein the multi-aperture stop is positioned upstream of the particle-optical component.

(54) The particle-optical arrangement according to one of Items (50) to (53), further comprising a multi-aperture stop for intercepting charged particles having passed the apertures of the peripheral region, wherein the multi-aperture stop is positioned downstream of the particle-optical component.

(55) A particle-optical arrangement, in particular in combination with the particle-optical arrangement according to one of Items (1) to (54), the arrangement comprising:

at least one charged-particle source for generating a beam of charged particles, at least one multi-aperture plate having a plurality of apertures formed in the plate, wherein the plurality of apertures are arranged in a first pattern, wherein a plurality of charged-particle beamlets is formed from the beam of charged particles downstream of the aperture plate, a first voltage supply for supplying predetermined first voltages to the plurality of apertures, a first single-aperture plate arranged at a distance upstream or downstream of the multi-aperture plate, the first single-aperture plate having a single aperture for allowing the beam of charged particles or the plurality of charged-particle beamlets to pass therethrough; and a second voltage supply for supplying a predetermined second voltage to the first single-aperture plate, wherein the distance between the multi-aperture plate and the first single-aperture plate is less than five times a diameter of the single aperture of the first single-aperture plate, preferably less than four three the diameter, preferably less than two times the diameter and further preferred less than the diameter of the single aperture of the first single-aperture plate.

(56) A particle-optical arrangement, in particular in combination with the particle-optical arrangement according to one of Items (1) to (55), the arrangement comprising:

at least one charged-particle source for generating a beam of charged particles, at least one multi-aperture plate having a plurality of apertures formed in the plate, wherein the plurality of apertures are arranged in a first pattern, wherein a plurality of charged-particle beamlets is formed from the beam of charged particles downstream of the aperture plate, a first voltage supply for supplying predetermined first voltages to the plurality of apertures, a first single-aperture plate arranged at a distance upstream or downstream of the multi-aperture plate, the first single-aperture plate having a single aperture for allowing the beam of charged particles or the plurality of charged-particle beamlets to pass therethrough; and a second voltage supply for supplying a predetermined second voltage to the first single-aperture plate, wherein the distance between the multi-aperture plate and the first single-aperture plate is less than 75 mm, preferably less than 50 mm, further preferred less than 25 mm, further preferred less than 10 mm, and further preferred less than 5 mm.

(57) A particle-optical arrangement, in particular in combination with the particle-optical arrangement according to one of Items (1) to (56), the arrangement comprising:

at least one charged-particle source for generating at least one beam of charged particles, at least one multi-aperture plate having a plurality of apertures formed in the plate, wherein the plurality of apertures are arranged in a first pattern, wherein a plurality of charged-particle beamlets is formed from the beam of charged particles downstream of the aperture plate, a first voltage supply for supplying predetermined first voltages to the plurality of apertures, a first single-aperture plate arranged at a distance upstream or downstream of the multi-aperture plate, the first single-aperture plate having a single aperture for allowing the beam of charged particles or the plurality of charged-particle beamlets to pass therethrough; and a second voltage supply for supplying a predetermined second voltage to the first single-aperture plate, wherein the distance between the multi-aperture plate and the first single-aperture plate is selected such that it is less than one half, and in particular, less than one fourth, of an average focal length of the apertures of the multi aperture plate.

(58) A particle-optical arrangement, in particular in combination with the particle-optical arrangement according to one of Items (1) to (57), the arrangement comprising:

at least one charged-particle source for generating a beam of charged particles, at least one multi-aperture plate having a plurality of apertures formed in the plate, wherein the plurality of apertures are arranged in a first pattern, wherein a plurality of charged-particle beamlets is formed from the beam of charged particles downstream of the aperture plate, a first voltage supply for supplying predetermined first voltages to the plurality of apertures, a first single-aperture plate arranged at a distance upstream or downstream of the multi-aperture plate, the first single-aperture plate having a single aperture for allowing the beam of charged particles or the plurality of charged-particle beamlets to pass therethrough; and a second voltage supply for supplying a predetermined second voltage to the first single-aperture plate, wherein the distance between the multi-aperture plate and the first single-aperture plate is selected such that an average electrical field on a surface of the multi aperture plate at a center thereof is higher than 100 V/mm, higher than 200 V/mm, higher than 300 V/mm, higher than 500 V/mm, or higher than 1 kV/mm.

(59) The particle-optical arrangement according to one of Items (48) to (58), further comprising:

a second single-aperture plate arranged in between the multi-aperture plate and the first single-aperture plate and substantially parallel thereto, and a third voltage supply for supplying a predetermined third voltage to the second single-aperture plate, wherein the third voltage is below or equal to the average of the first voltages, or wherein the third voltage is in between the second voltage and the average of the first voltages.

(60) A particle-optical arrangement, in particular in combination with the particle-optical arrangement according to one of Items (1) to (59), the arrangement comprising:

at least one charged-particle source for generating a beam of charged particles, at least one multi-aperture plate having a plurality of apertures formed in the plate, wherein the plurality of apertures are arranged in a first pattern, wherein a plurality of charged-particle beamlets is formed from the beam of charged particles downstream of the aperture plate, a first voltage supply for supplying predetermined first voltages to the plurality of apertures, a first single-aperture plate arranged at a distance upstream or downstream of the multi-aperture plate, the first single-aperture plate having a single aperture for allowing the beam of charged particles or the plurality of charged-particle beamlets to pass therethrough; and a second voltage supply for supplying a predetermined second voltage to the first single-aperture plate, a second single-aperture plate arranged in between the multi-aperture plate and the first single-aperture plate, and a third voltage supply for supplying a predetermined third voltage different from the predetermined second voltage to the second single-aperture plate, wherein an arrangement of the multi aperture plate an the first and second single-aperture plates and a setting of the first, second and third voltages is configured to generate an electrical field at a surface of the multi-aperture plate, wherein a change in the voltage supplied to the first single-aperture plate such that the third voltage is supplied to the first single-aperture plate will result in a change of a field strength of the electrical field of more than 1%, more than 5%, or more than 10%.

(61) The particle-optical arrangement according to one of Items (55) to (60), further comprising:

a third single-aperture plate arranged at a distance from the multi-aperture plate and substantially parallel thereto, wherein the multi-aperture plate is positioned in between of the first and third single-aperture plates, the third single-aperture plate having a single aperture for allowing the beam of charged particles or the plurality of charged-particle beamlets to pass therethrough; and a fourth voltage supply for supplying a predetermined fourth voltage to the third single-aperture plate, wherein the distance between the multi-aperture plate and the third single-aperture plate is less than five times a diameter of the single aperture of the third single-aperture plate, preferably less than four three the diameter, preferably less than two times the diameter and further preferred less than the diameter of the single aperture of the third single-aperture plate.

(62) A particle-optical arrangement, in particular in combination with the particle-optical arrangement according to one of Items (1) to (61), the arrangement comprising:
at least one charged-particle source for generating a beam of charged particles,
at least one multi-aperture plate having a plurality of apertures formed in the plate, wherein the plurality of apertures being arranged in a first pattern, wherein a plurality of charged-particle beamlets is formed from the beam of charged particles downstream of the aperture plate;
a first focusing lens providing a focusing field in a first region between the charged-particle source and the multi-aperture plate; and
a decelerating electrode providing a decelerating field in a second region in between of the first focusing lens and the multi-aperture plate, such that a kinetic energy of the charged particles passing the first focusing lens is higher than a kinetic energy of the charged particles passing the multi-aperture plate.

(63) A particle-optical arrangement, in particular in combination with the particle-optical arrangement according to one of Items (1) to (62), the arrangement comprising:
at least one charged-particle source for generating at least one beam of charged particles,
at least one multi-aperture plate having a plurality of apertures formed in the plate, wherein the plurality of apertures being arranged in a first pattern, and wherein a plurality of charged-particle beamlets is formed from the beam of charged particles downstream of the aperture plate;
wherein a kinetic energy of the beam of charged particles immediately upstream of the multi aperture plate is higher than 5 keV, in particular higher than 10 keV, in particular higher than 20 keV, and in particular higher than 30 keV.

(64) A particle-optical arrangement, in particular in combination with the particle-optical arrangement according to one of Items (1) to (63), the arrangement comprising:
at least one charged-particle source for generating a beam of charged particles,
at least one multi-aperture plate having a plurality of apertures formed in the plate, wherein the plurality of apertures being arranged in a first pattern, wherein a plurality of charged-particle beamlets is formed from the beam of charged particles downstream of the aperture plate;
a first focusing lens providing a focusing field in a first region upstream and/or downstream of the multi-aperture plate; and
an energy changing electrode providing an electrical field for changing a kinetic energy of charged particles of the beam in a second region upstream and/or downstream of the multi-aperture plate, and wherein the first region where the focusing field is provided and the second region where the energy changing field is provided are overlapping regions.

(65) The particle-optical arrangement according to Item (64), wherein the overlapping regions are located substantially upstream of the multi-aperture plate.

(66) The particle-optical arrangement according to Item (64), wherein the overlapping regions are located substantially downstream of the multi-aperture plate.

(67) The particle-optical arrangement according to one of Items (64) to (66), wherein the energy changing field is a decelerating electrical field for reducing the kinetic energy of the charged particles of the beam.

(68) The particle-optical arrangement according to one of Items (64) to (66), wherein the energy changing field is an accelerating electrical field for increasing the kinetic energy of the charged particles of the beam.

(69) The particle-optical arrangement according to one of Items (64) to (68), wherein an overlap between the energy changing field and the focusing field is more than 1%, in particular more than 5%, or more than 10%.

(70) A particle-optical arrangement, in particular in combination with the particle-optical arrangement according to one of Items (1) to (69), the arrangement comprising:
at least one charged-particle source for generating at least one beam of charged particles,
at least one multi-aperture plate having a plurality of apertures formed in the plate, wherein the plurality of apertures being arranged in a first pattern, wherein a plurality of charged-particle beamlets is formed from the beam of charged particles downstream of the aperture plate; and
a first focusing lens providing a focusing field in a region between the charged-particle source and the multi-aperture plate;
wherein the beam of charged particles is a divergent or convergent beam in a region immediately upstream of the multi-aperture plate.

(71) A particle-optical arrangement, in particular in combination with the particle-optical arrangement according to one of Items (1) to (70), the arrangement comprising:
at least one charged-particle source for generating at least one beam of charged particles,
at least one multi-aperture plate having a plurality of apertures formed in the plate, wherein the plurality of apertures is arranged in a first pattern, wherein a plurality of charged-particle beamlets is formed from the beam of charged particles downstream of the aperture plate; and
a first focusing lens providing a magnetic field having a focusing field portion in a region between the charged-particle source and the multi-aperture plate;
wherein the at least one charged-particle source is arranged within the magnetic field provided by the first focusing lens.

(72) The particle-optical arrangement of Item (71), wherein the magnetic field where the at least one charged-particle source is arranged is a substantially homogeneous magnetic field.

(73) A particle-optical arrangement, in particular in combination with the particle-optical arrangement according to one of Items (1) to (72), the arrangement comprising:
at least one charged-particle source for generating a beam of charged particles;
at least one multi-aperture plate having a plurality of apertures formed in the plate, wherein the plurality of apertures is arranged in a first pattern, wherein a plurality of charged-particle beamlets is formed from the beam of charged particles downstream of the multi-aperture plate, each of the charged-particle beamlets having a focus in a focusing region of the multi-aperture plate; and
a second focusing lens providing a focusing field in the focusing region.

(74) A particle-optical arrangement, in particular in combination with the particle-optical arrangement according to one of Items (1) to (73), the arrangement comprising:
at least one charged-particle source for generating a beam of charged particles;
at least one multi-aperture plate having a plurality of apertures formed in the plate, wherein the plurality of apertures is arranged in a first pattern, wherein a plurality of charged-particle beamlets is formed from the beam of charged particles downstream of the multi-aperture plate, each of the charged-particle beamlets having a focus in a focusing region of the multi-aperture plate downstream of the multi-aperture plate; and an objective lens for imaging substantially the focusing region of the multi-aperture plate onto an object positionable in an object plane of the arrangement.

(75) The particle-optical arrangement according to one of Items (1) to (74), wherein two multi-aperture plates are provided on opposite sides of an insulating spacer, wherein apertures in both the multi-aperture plates and apertures in the insulating spacer together form a plurality of through-holes.

(76) The particle-optical arrangement according to one of Items (1) to (74), wherein a central multi-aperture plate is sandwiched between two insulating spacers and wherein two outer multi-aperture plates are each provided on one respective insulating spacer, wherein apertures in the central and outer multi-aperture plates and apertures in the insulating spacers together form a plurality of through-holes.

(77) The particle-optical arrangement according to one of Items (1) to (76), wherein the apertures of the multi-aperture plate are positioned according to a substantially rectangular pattern.

(78) The particle-optical arrangement according to one of Items (1) to (76), wherein the apertures of the multi-aperture plate are positioned according to a substantially hexagonal pattern.

(79) An electron-optical arrangement, in particular in combination with the particle optical-arrangement according to claim one of Items (1) to (78), the electron microscopy arrangement providing a primary beam path for a beam of primary electrons directed from a primary electron source to an object positionable in an object plane of the arrangement, and a secondary beam path for secondary electrons originating from the object, the electron microscopy arrangement comprising a magnet arrangement having:

a first magnetic field region passed by the primary electron beam path and the secondary electron beam path for separating the primary electron beam path and the secondary electron beam path from each other, a second magnetic field region arranged in the primary electron beam path upstream of the first magnetic field region, wherein the second magnetic field region is not passed by the secondary electron beam path, and wherein the first and second magnetic field regions deflect the primary electron beam in substantially opposite directions, a third magnetic field region arranged in the secondary electron beam path downstream of the first magnetic field region, wherein the third magnetic field region is not passed by the first electron beam path, and wherein the first and third magnetic field regions deflect the secondary electron beam path in a substantially same direction.

(80) The electron microscopy arrangement according to Item (79), wherein no further magnetic field regions deflecting the primary electron beam by more than 5°, in particular more than 10°, are provided in the primary electron beam path apart from the first and second magnetic field regions.

(81) The electron microscopy arrangement according to Item (79) or (80), wherein a deflection angle of the second magnetic field region for the primary electron beam path is higher than a deflection angle of the first magnetic field region for the primary electron beam path.

(82) The electron microscopy arrangement according to one of Items (79) to (81), wherein a deflection angle of the first magnetic field region for the secondary electron beam path is lower than a deflection angle of the second magnetic field region for the primary electron beam path.

(83) The electron microscopy arrangement according to one of Items (79) to (82), wherein a first drift region, which is substantially free of magnetic fields, is provided in the primary electron beam path between the second and first magnetic field regions.

(84) The electron microscopy arrangement according to one of Items (79) to (83), wherein a second drift region, which is substantially free of magnetic fields, is provided in the secondary electron beam path between the first and third magnetic field regions.

(85) The electron microscopy arrangement according to one of Items (79) to (84), further comprising an objective lens provided in between of the first magnetic field region and the object plane, wherein the objective lens is passed by the primary and secondary electron beam paths.

(86) The electron microscopy arrangement according to one of Items (79) to (85), further comprising at least one electrode provided in between of the first magnetic field region and the object plane, wherein the at least one electrode is passed by the primary electron beam path for decelerating the primary electrons before impinging on the object, wherein the at least one electrode is passed by the secondary electron beam path for accelerating the secondary electrons after emerging from the object.

(87) The electron microscopy arrangement according to Item (86), further comprising a driver for supplying an adjustable voltage to the at least one electrode.

(88) The electron microscopy arrangement according to Item (87), further comprising a controller for changing a magnetic field strength in the third magnetic field region relative to a magnetic field strength in the first magnetic field region in dependence of the voltage supplied to the at least one electrode.

(89) The electron microscopy arrangement according to Item (88), wherein the magnet arrangement further comprises a fourth magnetic field region in the secondary electron beam path downstream of the third magnetic field region, wherein a magnetic field strength in the fourth magnetic field region is adjustable relative to a magnetic field strength in the third magnetic field region.

(90) The electron microscopy arrangement according to Item (89), further comprising a controller for changing the field strength in the fourth magnetic field region relative to the field strength in the third magnetic field region in dependence of the voltage supplied to the at least one electrode.

(91) The electron microscopy arrangement according to Item (89) or (90), wherein the third and fourth magnetic field regions are arranged substantially directly adjacent to each other in the secondary electron beam path.

(92) The electron microscopy arrangement according to one of Items (87) to (91), further comprising at least one quadrupole lens arranged in the secondary electron beam path downstream of the third magnetic field region, in particular downstream of the fourth magnetic field region.

(93) The electron microscopy arrangement according to Item (92), further comprising a controller for changing a field strength of the quadrupole lens in dependence of the voltage supplied to the at least one electrode.

(94) The electron microscopy arrangement according to one of Items (89) to (93), further comprising a fifth magnetic field region arranged in the secondary electron beam path in between of the fourth magnetic field region and the quadrupole lens.

(95) The electron microscopy arrangement according to Item (94), further comprising a controller for changing the field strength in the fifth magnetic field region relative to the field strength in the third magnetic field region in dependence of the voltage supplied to the at least one electrode.

(96) The electron microscopy arrangement according to Item (94) or (95), wherein the fourth and fifth magnetic field regions are arranged substantially directly adjacent to each other in the secondary electron beam path.

(97) The electron microscopy arrangement according to one of Items (79) to (96), wherein an intermediate image of the object plane is formed by the secondary electrons in a region comprising the first, third, fourth and fifth magnetic field regions.

(98) The electron microscopy arrangement according to one of Items (79) to (97), further comprising a detector arranged in the secondary beam path downstream of the third magnetic field region.

(99) The electron microscopy arrangement according to one of Items (79) to (98), further comprising a transfer lens arrangement arranged in the secondary beam path upstream of the detector.

(100) The electron microscopy arrangement according to one of Items (79) to (99), wherein substantially homogeneous magnetic fields are provided in the first and/or second and/or third and/or fourth and/or fifth magnetic field regions, respectively.

(101) The electron-optical arrangement according to one of Items (1) to (100), further comprising a comb lens arrangement having a line of plural of field source members, and a controller for energizing the field source members such that an electron-optical property provided by the comb lens is displaceable along the line.

(102) An electron microscopy system for inspecting an object positionable in an object plane of the arrangement, the electron microscopy system comprising:
the particle-optical arrangement according to one of Items (1) to (101) for generating a plurality of primary electron beamlets focused on the object; and
a detector for detecting secondary electrons originating from the object.

(103) The electron microscopy system according to Item (102), wherein a plurality of secondary electron beamlets is formed from the secondary electrons originating from the object.

(104) The electron microscopy system according to Item (103), wherein a number of the secondary electron beamlets detected by the detector is lower than a number of primary electron beamlets focused on the object.

(105) An electron lithography system for exposing an electron sensitive substrate, the electron lithography system comprising:
the particle-optical arrangement according to one of Items (1) to (101) for generating a plurality of writing electron beamlets focused on the substrate.

(106) An electron lithography system according to Item (105), further comprising a detector for detecting secondary electrons originating from the object.

Therefore, while the present invention has been shown and described herein in what is believed to be the most practical and preferred embodiments, it is recognized that departures can be made therefrom within the scope of the invention, which is therefore not to be limited to the details disclosed herein but is to be accorded the full scope of the claims so as to embrace any and all equivalent methods and apparatus.

The invention claimed is:

1. A particle-optical arrangement, comprising:
at least one charged-particle source for generating at least one beam of charged particles;
at least one multi-aperture plate having a plurality of apertures formed in the multi-aperture plate, wherein the plurality of apertures being arranged in a first pattern, wherein a plurality of charged-particle beamlets is formed from the beam of charged particles downstream of the multi-aperture aperture plate;
a first focusing lens providing a focusing field in a first region between the charged-particle source and the multi-aperture plate; and
a decelerating electrode providing a decelerating field in a second region in between the first focusing lens and the multi-aperture plate, such that a kinetic energy of the charged particles passing the first focusing lens is higher than a kinetic energy of the charged particles passing the multi-aperture plate.

2. A particle-optical arrangement, comprising:
at least one charged-particle source for generating at least one beam of charged particles,
at least one multi-aperture plate having a plurality of apertures formed in the multi-aperture plate, wherein a plurality of charged-particle beamlets is formed from the beam of charged particles downstream of the multi-aperture aperture plate;
a first focusing lens providing a focusing field in a first region adjacent to the multi-aperture plate in a direction of the at least one beam; and
an energy changing electrode providing an electrical field for changing a kinetic energy of charged particles of the beam in a second region adjacent to the multi-aperture plate in the direction of the at least one beam, and wherein the first region where the focusing field is provided and the second region where the energy changing field is provided are overlapping regions.

3. The particle-optical arrangement according to claim 2, wherein the overlapping regions are located substantially upstream of the multi-aperture plate, wherein an overlap between the energy changing field and the focusing field is more than 1%.

4. The particle-optical arrangement according to claim 2, wherein the overlapping regions are located substantially downstream of the multi-aperture plate, wherein an overlap between the energy changing field and the focusing field is more than 1%.

5. The particle-optical arrangement according to claim 2, wherein the energy changing field is a decelerating electrical field for reducing the kinetic energy of the charged particles of the beam.

6. The particle-optical arrangement according to claim 2, wherein the energy changing field is an accelerating electrical field for increasing the kinetic energy of the charged particles of the beam.

7. A multi-electron-beamlet inspection system, comprising:
a stage for mounting an object to be inspected;
at least one electron source for generating at least one electron beam;
at least one multi-aperture plate having a plurality of apertures formed in the plate, wherein the plurality of apertures is arranged in a first pattern, wherein a plurality of charged-particle beamlets is formed from the beam of charged particles downstream of the aperture plate;
a first focusing lens providing a focusing field in a first region between the charged-particle source and the multi-aperture plate;
a decelerating electrode providing a decelerating field in a second region in between of the first focusing lens and the multi-aperture plate, such that a kinetic energy of the charged particles passing the first focusing lens is higher than a kinetic energy of the charged particles passing the multi-aperture plate;
an objective lens for focusing the array of electron beamlets on the object to be inspected; and
a detector arrangement for detecting secondary electrons from the object generated by the plurality of beamlets, to produce an array of signals corresponding to the secondary electrons generated by substantially a single electron beamlet in the plurality of beamlets.

8. A charged-particle multi-beamlet lithography system for writing a pattern on a resist coated object, the system comprising:
a stage for mounting the object;
at least one electron source for generating at least one electron beam;
at least one multi-aperture plate having a plurality of apertures formed in the plate, wherein the plurality of apertures being arranged in a first pattern, wherein a plurality of charged-particle beamlets is formed from the beam of charged particles downstream of the aperture plate;
a first focusing lens providing a focusing field in a first region between the charged-particle source and the multi-aperture plate;
a decelerating electrode providing a decelerating field in a second region in between of the first focusing lens and the multi-aperture plate, such that a kinetic energy of the charged particles passing the first focusing lens is higher than a kinetic energy of the charged particles passing the multi-aperture plate;
an objective lens for focusing the plurality of beamlets on the object to be inspected; and
an objective lens for focusing the plurality of beamlets on the object.

9. A method of forming a plurality of charged-particle beamlets, the method comprising:
generating at least one beam of charged particles, the particles having a first kinetic energy;
providing first focusing lens on the at least one beam of charged particles in a first region;
forming the plurality of charged-particle beamlets from the at least one beam of charged particles with at least one multi-aperture plate disposed downstream of the first region and having a plurality of apertures formed in the plate;
providing a decelerating field in a second region downstream of the first region such that the particles have a second kinetic energy downstream of the second region, wherein the second kinetic energy is less than the first kinetic energy.

10. A method of multi-electron-beamlet inspection of a substrate, the method comprising:
generating at least one beam of electrons, the electrons having a first kinetic energy;
providing first focusing lens on the at least one beam of electrons in a first region;
forming a plurality of electron beamlets from the at least one beam of electrons with at least one multi-aperture plate disposed downstream of the first region and having a plurality of apertures formed in the plate;
providing a decelerating field in a second region downstream of the first region such that the electrons have a second kinetic energy downstream of the second region, wherein the second kinetic energy is less than the first kinetic energy; and
forming an array of electron beam spots with the plurality of beamlets on the substrate.

11. A method of writing a pattern on a resist coated object, the method comprising:
generating at least one beam of electrons, the electrons having a first kinetic energy;
providing first focusing lens on the at least one beam of electrons in a first region;
forming a plurality of electron beamlets from the at least one beam of electrons with at least one multi-aperture plate disposed downstream of the first region and having a plurality of apertures formed in the plate;
providing a decelerating field in a second region downstream of the first region such that the electrons have a second kinetic energy downstream of the second region, wherein the second kinetic energy is less than the first kinetic energy; and
forming an array of electron beam spots on the resist coated object with the plurality of beamlets.

12. A multi-electron-beamlet inspection system, comprising:
a stage for mounting an object to be inspected;
at least one charged-particle source for generating a beam of electrons,
at least one multi-aperture plate having a plurality of apertures formed in the plate, wherein the plurality of apertures being arranged in a first pattern, and wherein a plurality of electron beamlets is formed from the beam of electrons downstream of the aperture plate;
a first focusing lens providing a focusing field in a first region adjacent to the multi-aperture plate in a direction of the at least one beam;
an energy changing electrode providing an electrical field for changing a kinetic energy of electrons of the beam in a second region adjacent to the multi-aperture plate in the direction of the at least one beam, and wherein the first region where the focusing field is provided and the second region where the energy changing field is provided are overlapping regions; and
a detector arrangement for detecting secondary electrons from the object generated by the plurality of beamlets, to produce an array of signals corresponding to the secondary electrons generated by substantially a single beamlet in the plurality of beamlets.

13. A charged-particle multi-beamlet lithography system for writing a pattern on a resist coated object, the system comprising:
a stage for mounting the object;
at least one charged-particle source for generating at least one charged-particle beam;
at least one multi-aperture plate having a plurality of apertures formed in the plate, wherein a plurality of charged-particle beamlets is formed from the beam of charged particles downstream of the aperture plate;
a first focusing lens providing a focusing field in a first region adjacent to the multi-aperture plate in a direction of the at least one beam; and
an energy changing electrode providing an electrical field for changing a kinetic energy of charged particles of the beam in a second region adjacent to the multi-aperture plate in the direction of the at least one beam, and wherein the first region where the focusing field is provided and the second region where the energy changing field is provided are overlapping regions;
an objective lens for focusing the plurality of beamlets on the object.

14. A method of multi-electron-beamlet inspection of a substrate, the method comprising:

generating at least one beam of charged particles, the particles;

forming the plurality of charged-particle beamlets from the at least one beam of charged particles with at least one multi-aperture plate having a plurality of apertures formed in the plate;

providing a focusing field and a kinetic energy changing field overlapping the focusing field, wherein the energy changing field changes a kinetic energy of the at least one beam of charged particles upstream of the at least one multi-aperture plate; and forming an array of electron beam spots with the plurality of beamlets on the substrate.

15. A method of writing a pattern on a resist coated object, the method comprising:

generating at least one beam of charged particles, the particles;

forming the plurality of charged-particle beamlets from the at least one beam of charged particles with at least one multi-aperture plate having a plurality of apertures formed in the plate;

providing a focusing field and a kinetic energy changing field overlapping the focusing field, wherein the energy changing field changes a kinetic energy of the at least one beam of charged particles upstream of the at least one multi-aperture plate; and forming an array of electron beam spots on the resist coated object with the plurality of electron beamlets.

* * * * *

UNITED STATES PATENT AND TRADEMARK OFFICE
CERTIFICATE OF CORRECTION

PATENT NO.        : 9,673,024 B2
APPLICATION NO.   : 14/975314
DATED             : June 6, 2017
INVENTOR(S)       : Rainer Knippelmeyer et al.

It is certified that error appears in the above-identified patent and that said Letters Patent is hereby corrected as shown below:

Column 6, Line 9: "250 to to" should read --250Ω to--

Column 16, Lines 1 and 2: "Range" should read --range--

Column 20, Line 10: "i" should read --"i"--

Column 23, Line 12: "1" should read --l--

Column 23, Line 13: "1" should read --l--

Column 35, Line 61: "on" should read --one--

Column 36, Line 2: "on" should read --one--

Column 38, Line 41: "an" should read --and--

Signed and Sealed this
Fifteenth Day of August, 2017

Joseph Matal
*Performing the Functions and Duties of the
Under Secretary of Commerce for Intellectual Property and
Director of the United States Patent and Trademark Office*